(12) United States Patent
Otsuka et al.

(10) Patent No.: US 7,827,463 B2
(45) Date of Patent: Nov. 2, 2010

(54) SEMICONDUCTOR MEMORY DEVICE

(75) Inventors: Shuzo Otsuka, Kawasaki (JP);
Kuninori Kawabata, Kawasaki (JP);
Toshikazu Nakamura, Kawasaki (JP);
Akira Kikutake, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1208 days.

(21) Appl. No.: 11/270,533

(22) Filed: Nov. 10, 2005

(65) Prior Publication Data

US 2006/0236206 A1 Oct. 19, 2006

(30) Foreign Application Priority Data

Mar. 31, 2005 (JP) ............... 2005-102459

(51) Int. Cl.
*H03M 13/00* (2006.01)
(52) U.S. Cl. ...................... 714/753; 714/762
(58) Field of Classification Search .............. 714/753, 714/762
See application file for complete search history.

(56) References Cited

U.S. PATENT DOCUMENTS

| | | | | |
|---|---|---|---|---|
| 4,291,406 A | * | 9/1981 | Bahl et al. ............... 714/787 |
| 4,321,704 A | * | 3/1982 | Lemoine ................. 714/800 |
| 5,353,423 A | * | 10/1994 | Hamid et al. ............ 711/143 |
| 5,781,918 A | * | 7/1998 | Lieberman et al. ...... 711/5 |
| 6,697,992 B2 | | 2/2004 | Ito et al. |

FOREIGN PATENT DOCUMENTS

| | | |
|---|---|---|
| JP | 04-291084 | 10/1992 |
| JP | 2002-056671 | 2/2002 |

* cited by examiner

*Primary Examiner*—Scott T Baderman
*Assistant Examiner*—Enam Ahmed
(74) *Attorney, Agent, or Firm*—Fujitsu Patent Center

(57) ABSTRACT

In a semiconductor memory device having an error-correction function: one or both of a portion of a set of data bits and a set of parity bits based on the set of data bits are held, where the set of data bits and the set of parity bits constitute a code for error correction and are written in memory cells in the leading write cycle in a burst write operation. The set of parity bits written in memory cells in the leading write cycle is updated in the final write cycle on the basis of the portion of the set of data bits and/or the set of parity bits, and another set of data bits required to be written in the final write cycle in the memory cells at the address at which the above portion is written in the leading write cycle.

10 Claims, 21 Drawing Sheets

SEMICONDUCTOR MEMORY DEVICE

CROSS-REFERENCE TO RELATED APPLICATIONS

This application is based upon and claims the benefits of priority from the prior Japanese Patent Application No. 2005-102459, filed on Mar. 31, 2005, the entire contents of which are incorporated herein by reference.

BACKGROUND OF THE INVENTION

1) Field of the Invention

The present invention relates to a semiconductor memory device which has an error-correction function (for correcting defective bits) and a burst-mode function.

2) Description of the Related Art

The semiconductor memory devices having the burst-mode function are known (for example, as disclosed in Japanese Unexamined Patent Publication No. 4-291084). According to the burst-mode function, a plurality of data pieces are transferred together in response to one operation of designating addresses of a memory core so that the data transfer rate is increased.

FIG. 15 is a timing diagram of signals in a burst-mode (write) operation performed in a conventional semiconductor memory device in the case where the start address is A(1). In the example of FIG. 15, the write latency (WL) is two, and the burst length (BL) is eight. When the start address is inputted, a word line corresponding to the start address is selected, a voltage difference occurs between the pair of bit lines b1 and b1b, and a sense operation is started. The address is sequentially incremented as A(1)→A(2)→A(3)→A(4)→A(5)→A(6)→A(7)→A(8), although the addresses A(2) to A(8) are not indicated in FIG. 15. While the address is changed as above, the word-line selection address w1 is not changed. The data pieces to be written (hereinafter referred to as write-data pieces) are captured in the order of W1(1)→W1(2)→W1(3)→W1(4)→W2(1)→W2(2)→W2(3)→W2(4). In this specification, it is assumed that the size of each data piece is 16 bits unless otherwise specified. The data pieces to be written are respectively outputted onto data buses being arranged between input terminals DQ and memory cells and having the total width of 64 bits, and the data pieces on the data buses are changed one after another as W1(1)→W2(1), W1(2)→W2(2), W1(3)→W2(3), and W1(4)→W2(4). The data pieces outputted onto the data buses and constituted by 64 bits are written in the memory cells in each of the two write cycles in which the address is A(4) and A(8), respectively. The timings of the address increment and the data capture are synchronized with the clock signal CLK. The data pieces W1(1) to W1(4) are written in the memory cells in the first write cycle (in which the address is A(4)). At this time, the column-selection signals CL1(1) to CL1(4) are active. In addition, the data pieces W2(1) to W2(4) are written in the memory cells in the second write cycle (in which the address is A(8)). At this time, the column-selection signals CL2(1) to CL2(4) are active. The time interval (expressed by the number of clock cycles) from the clock timing in synchronization with which the final write cycle (the above write operation in the second write cycle in this example) is started, until the bit lines are equalized and the start of the next command (WR or RD) is enabled is called the write recovery time (tWRB).

The burst-mode operation may be started from another address (A(2), A(3), or A(4)) instead of A(1). Even in such a case, the four column-selection signals CL1(1) to CL1(4) or the four column-selection signals CL2(1) to CL2(4) are concurrently activated, and the following control operations are performed.

FIG. 16 is a timing diagram of signals in a burst-mode (write) operation performed in the conventional semiconductor memory device in the case where the start address is A(2).

In this case, the address is sequentially incremented as A(2)→A(3)→A(4)→A(5)→A(6)→A(7)→A(8)→A(1). While the address is changed as above, the word-line selection address w1 is not changed. The data pieces to be written are captured in the order of W1(2)→W1(3)→W1(4)→W2(1)→W2(2)→W2(3)→W2(4)→W1(1). The data pieces to be written are respectively outputted on data buses being arranged between the input terminals DQ and the memory cells and having the total width of 64 bits, and the data pieces on the data buses are changed one after another as W1(2)→W2(2), W1(3)→W2(3), W1(4)→W2(4), and W1(1)→W2(1). The data pieces outputted onto the data buses and constituted by 64 bits are written in the memory cells in each of the three write cycles in which the address is A(4), A(8), and A(1), respectively. The timings of the address increment and the data capture are synchronized with the clock signal CLK. The data pieces W1(2) to W1(4) are written in the memory cells in the first write cycle (in which the address is A(4)). At this time, although the column-selection signals CL1(1) to CL1(4) are active, the data piece W1(1) is masked and is not written in the memory cells. In addition, the data pieces W2(1) to W2(4) are written in the memory cells in the second write cycle (in which the address is A(8)). At this time, the column-selection signals CL2(1) to CL2(4) are active. Further, the data piece W1(1) is written in the memory cells in the third write cycle (in which the address is A(1)). At this time, although the column-selection signals CL1(1) to CL1(4) are active, the data pieces W1(2) to W1(4) are masked and are not written in the memory cells. That is, the same column-selection signals CL1(1) to CL1(4) are activated in the first and third write cycles. The write recovery times (tWRB) in the burst-mode (write) operations of FIGS. 15 and 16 are identical.

FIG. 17 is a timing diagram of signals in a burst-mode (write) operation performed in the conventional semiconductor memory device in the case where the start address is A(3).

In this case, the address is sequentially incremented as A(3)→A(4)→A(5)→A(6)→A(7)→A(8)→A(1)→A(2). While the address is changed as above, the word-line selection address w1 is not changed. The data pieces to be written are captured in the order of W1(3)→W1(4)→W2(1)→W2(2)→W2(3)→W2(4)→W1(1)→W1(2). The data pieces to be written are respectively outputted on data buses being arranged between the input terminals DQ and the memory cells and having the total width of 64 bits, and the data pieces on the data buses are changed one after another as W1(3)→W2(3), W1(4)→W2(4), W1(1)→W2(1), and W1(2)→W2(2). The data pieces outputted onto the data buses and constituted by 64 bits are written in the memory cells in each of the three write cycles in which the address is A(4), A(8), and A(2), respectively. The timings of the address increment and the data capture are synchronized with the clock signal CLK. The data pieces W1(3) and W1(4) are written in the memory cells in the first write cycle (in which the address is A(4)). At this time, although the column-selection signals CL1(1) to CL1(4) are active, the data pieces W1(1) and W1(2) are masked and are not written in the memory cells. In addition, the data pieces W2(1) to W2(4) are written in the memory cells in the second write cycle (in which the address is A(8)). At this time, the column-selection signals CL2(1) to CL2(4) are active. Further, the data pieces W1(1) and W1(2) are written in the memory cells in the third write cycle (in which the address is A(2)). At this time, although the column-selection signals CL1(1) to CL1(4) are active, the data pieces W1(2) to W1(4) are masked and are not written in the memory cells. That is, the same column-selection signals CL1(1) to CL1(4) are activated in the first and third write cycles. The write recovery times (tWRB) in the burst-mode (write) operations in the case of FIGS. 15, 16, and 17 are identical.

Since the above control operations are performed, the conventional semiconductor memory device having a burst-mode function can perform a burst-mode operation without reducing the operation speed even when the start address is changed.

Recently, the ECC (error checking and correcting) function is installed as a measure for coping with defects caused by abrupt variations in the holding times in the memory cells which require a refresh operation as in the memory cells in the DRAM (dynamic random access memory). For example, provision of such a function is disclosed in Japanese Unexamined Patent Publication No. 2002-56671.

The ECC function which can correct a single-bit error is widely used. In the case where such a function is used, even a single-bit error contained in data read out from the memory cells can be corrected. In the examples used in the following descriptions, Hamming codes as ECC codes are produced by using 64 data bits and seven parity bits.

FIG. 18 is a block diagram of first circuitry realizing an ECC function and a burst-mode function in a conventional semiconductor memory device. The conventional semiconductor memory device 800 of FIG. 18 comprises a syndrome generation circuit 801, a decoder 802, an error correction circuit 803, a data selection circuit 804, write-data holding circuits 805-1, 805-2, 805-3, and 805-4, write-status holding circuits 806-1, 806-2, 806-3, and 806-4, read/write data selection circuits 807-1, 807-2, 807-3, and 807-4, and a parity generation circuit 808. In FIG. 18, the memory cells are not indicated.

The syndrome generation circuit 801 generates a 7-bit syndrome signal S on the basis of data pieces r(1), r(2), r(3), and r(4) read out from the memory cells (hereinafter referred to as read-data pieces) and a set of seven parity bits P0, which are read out from the memory cells. Each of the read-data pieces r(1), r(2), r(3), and r(4) is constituted by 16 bits, and thus the total number of bits of the read-data pieces r(1), r(2), r(3), and r(4) is 64.

The decoder 802 decodes the syndrome signal S, and generates 64-bit error correction flags err. The error correction circuit 803 corrects (inverts) a bit of the read-data pieces r(1), r(2), r(3), and r(4) corresponding to one of the error correction flags err when the one of the error correction flags err is valid, and outputs corrected read-data pieces R(1), R(2), R(3), and R(4).

The data selection circuit 804 performs parallel-to-serial conversion of 64-bit data outputted from the memory cells, into 16-bit form for outputting the converted data through 16-bit I/O ports, in response to an output enable signal.

The write-data holding circuits 805-1, 805-2, 805-3, and 805-4 capture 16-bit write-data pieces (i.e., data to be written in the memory cells) from the I/O ports in turn in response to write enable signals WE1, WE2, WE3, and WE4, respectively, and hold the captured write-data pieces as write-data pieces W(1), W(2), W(3), and W(4). The write-status holding circuits 806-1, 806-2, 806-3, and 806-4 determine whether or not the captured write-data pieces is to be written in the memory cells, in response to a status initialization signal.

Each read/write data selection circuit 807-$i$ determines one of the write-data piece W(i) and the corrected read-data piece R(i) as a data piece C (i) which is to be written in the memory cells, according to a signal outputted from the corresponding write-status holding circuit 806-$i$, and the parity generation circuit 808 receives the data piece C(i) determined by the read/write data selection circuit 807-$i$, generates a set of seven parity bits P on the basis of the received data piece C(i), and outputs the set of seven parity bits P, where $1 \leq i \leq 4$.

In the following explanations, it is assumed that the burst length (BL) is eight, and the minimum unit of the write data (which is referred to as a write block or a word structure) is constituted by 16 bits. In this case, when the addresses A(1) to A(8) are supplied to the semiconductor memory device for the burst-mode operation, the 64-bit data corresponding to the four successive addresses A(1) to A(4), or A(5) to A(8) constitute the ECC code.

FIG. 19 is a timing diagram of signals in a burst-mode (write) operation performed in the conventional semiconductor memory device 800 (having the ECC function) in the case where the start address is A(1) and the write latency (WL) is two as in the case of FIG. 15. However, in the semiconductor memory device 800 having the ECC function, when data are written in the memory cells, it is necessary to read out read-data pieces r(1) to r(4) from the memory cells for generation of a set of parity bits. Hereinafter, this operation is referred to as an ECC-RD operation. It is assumed that the duration of the ECC-RD operation is shorter than the period of the clock signal.

When a word line is selected according to the start address, a voltage difference occurs between the pair of bit lines b1 and b1$b$, and a sense operation is started. At this time, in order to perform the ECC-RD operation, the duration in which a column-selection line in the memory cells is active is different from the corresponding duration in the case of FIG. 15. Regardless of the start address, at the times of the ECC-RD and write (WR) operations, the four column-selection signals CL1(1) to CL1(4) or the four column-selection signals CL2(1) to CL2(4) are active. Even after the ECC-RD operation is completed, the four column-selection signals CL1(1) to CL1(4) or the four column-selection signals CL2(1) to CL2(4) are maintained active. The write operations are performed in two write cycles in which the address is A(4) and A(8), respectively. In each write operation, the data pieces C(1), C(2), C(3), and C(4) selected by the read/write data selection circuits 807-1, 807-2, 807-3, and 807-4 and the set of parity bits P generated by the parity generation circuit 808 are written in the memory cells. The write-data pieces W1(1) to W1(4) are selected as the data pieces C(1) to C(4) in the first write cycle, and the write-data pieces W2(1) to W2(4) are selected as the data pieces C(1) to C(4) in the second write cycle. The four column-selection signals CL1(1) to CL1(4) or the four column-selection signals CL2(1) to CL2(4) become inactive when the corresponding write operation is completed. In the case where the start address is A(1), the write recovery time (tWRB) is not changed even when the ECC operation is performed.

FIG. 20 is a timing diagram of signals in a burst-mode (write) operation performed in the conventional semiconductor memory device 800 (having the ECC function) in the case where the start address is A(2).

As in the case of FIG. 16, when a word line is selected according to the start address, a voltage difference occurs between the pair of bit lines b1 and b1$b$, and a sense operation is started. At this time, in order to perform the ECC-RD operation, the duration in which a column-selection line in the memory cells is active is different from the corresponding duration in the case of FIG. 16. At the times of the ECC-RD and write (WR) operations, the four column-selection signals CL1(1) to CL1(4) or the four column-selection signals CL2

(1) to CL2(4) are active. Even after the ECC-RD operation is completed, the four column-selection signals CL1(1) to CL1(4) or the four column-selection signals CL2(1) to CL2(4) are maintained active. The write operations are performed in each of three write cycles in which the address is A(4), A(8), and A(1), respectively. In the first write cycle, in order to obtain a necessary number of data bits for generation of a set of parity bits P by the parity generation circuit 808, the corrected read-data piece R(1) (indicated in FIG. 18) which corresponds to the address A(1) and is read out and corrected by the ECC-RD operation and the write-data pieces W1(2) to W2(4) are selected and written as the data pieces C(1) to C(4), although the corrected read-data piece R(1) is not indicated in FIG. 20. In addition, the write-data pieces W2(1) to W2(4) are selected and written as the data pieces C(1) to C(4) in the second write cycle, and the write-data piece W1(1) is selected and written as the data piece C(1) in the third write cycle. Although the four column-selection signals CL1(1) to CL1(4) are active in the third write cycle, the write-data pieces W1(2) to W1(4) are masked and are not written in the memory cells. Instead, in order to obtain data bits necessary for generation of a set of parity bits P by the parity generation circuit 808, the corrected read-data pieces R(2) to R(4) read out and corrected by the ECC-RD operation are used as the write-data pieces W1(2) to W1(4). At this time, the read-data pieces R(2) to R(4) are the write-data pieces W1(2) to W1(4) which have been written by the first write cycle. Specifically, the read/write data selection circuit 807-1 selects and outputs the write-data piece W1(1), and the read/write data selection circuits 807-2, 807-3, and 807-4 select and output the corrected read-data pieces R(2) to R(4), according to the signals from the write-status holding circuits 806-1, 806-2, 806-3, and 806-4 illustrated in FIG. 18. The four column-selection signals CL1(1) to CL1(4) or the four column-selection signals CL2(1) to CL2(4) become inactive when the corresponding write operation is completed. Further, the same column-selection signals CL1(1) to CL1(4) are activated in the first and third write cycles.

The operations in FIG. 20 are greatly different from the operations in FIG. 16 in the write operation at the address A(1) (i.e., in the third write cycle). That is, since, in the case where the start address is A(2), the ECC-RD operation and the write operation are successively performed, the timing of the equalization of the bit lines is delayed by the duration of the ECC-RD operation. Therefore, the write recovery time (tWRB) in the burst-mode operation of FIG. 20 in the semiconductor memory device 10a having the ECC function is greater than the write recovery time (tWRB) in the burst-mode operation of FIG. 16 in the semiconductor memory device without the ECC function by one cycle of the clock signal.

FIG. 21 is a timing diagram of signals in a burst-mode (write) operation performed in the conventional semiconductor memory device 800 (having the ECC function) in the case where the start address is A(3).

As in the case of FIG. 17, when a word line is selected according to the start address, a voltage difference occurs between the pair of bit lines b1 and b1b, and a sense operation is started. At this time, in order to perform the ECC-RD operation, the duration in which a column-selection line in the memory cells is active is different from the corresponding duration in the case of FIG. 17. At the times of the ECC-RD and write (WR) operations, the four column-selection signals CL1(1) to CL1(4) or the four column-selection signals CL2(1) to CL2(4) are active. Even after the ECC-RD operation is completed, the four column-selection signals CL1(1) to CL1(4) or the four column-selection signals CL2(1) to CL2(4) are maintained active. The write operations are performed in three write cycles in which the address is A(4), A(8), and A(2), respectively. In the first write cycle, the corrected read-data pieces R(1) and R(2) (illustrated in FIG. 18) read out and corrected by the ECC-RD operation, and the write-data pieces W1(3) and W2(4) are selected and written as the data pieces C(1) to C(4), although the corrected read-data piece R(1) is not indicated in FIG. 20. In addition, the write-data pieces W2(1) to W2(4) are selected and written as the data pieces C(1) to C(4) in the second write cycle, and the write-data pieces W1(1) and W1(2) are selected and written as the data pieces C(1) and C(2) in the third write cycle. Although the four column-selection signals CL1(1) to CL1(4) are active in the third write cycle, the write-data pieces W1(3) and W1(4) are masked and are not written in the memory cells. Specifically, the read/write data selection circuits 807-1 and 807-2 select and output the write-data pieces W1(1) and W1(2) as the data pieces C(1) and C(2), and the read/write data selection circuits 807-3 and 807-4 select and output the corrected read-data pieces R(3) and R(4) as the data pieces C(3) and C(4), according to the signals from the write-status holding circuits 806-1, 806-2, 806-3, and 806-4 illustrated in FIG. 18. At this time, the read-data pieces R(3) and R(4) are the write-data pieces W1(3) and W1(4) which have been written by the first write cycle. The four column-selection signals CL1(1) to CL1(4) or the four column-selection signals CL2(1) to CL2(4) become inactive when the corresponding write operation is completed. Further, the same column-selection signals CL1(1) to CL1(4) are activated in the first and third write cycles.

The operations in FIG. 21 are greatly different from the operations in FIG. 17 in the write operation at the address A(2) (i.e., in the third write cycle). Although the ECC-RD operation and the write operation are successively performed in a similar manner to the case of FIG. 20 where the start address is A(2), the ECC-RD operation in the case of FIG. 21 where the start address is A(3) is completed before the write operation at the address A(2). Therefore, the duration of the equalization of the bit lines does not trespass on the time for the subsequent operations. Thus, the write recovery time (tWRB) is unaffected by the existence or absence of the ECC function. Although not explained, the write recovery time (tWRB) is also unaffected by the existence or absence of the ECC function in the case where the start address is A(4).

As explained above, in the conventional semiconductor memory device having the ECC function and the burst-mode function, the write recovery time increases depending on the start address (as in the case where the start address is A(2)).

SUMMARY OF THE INVENTION

The present invention is made in view of the above problems, and the object of the present invention is to provide a semiconductor memory device which can suppress deterioration of the write recovery time regardless of the start address in the burst-mode operation.

In order to accomplish the above object, according to the present invention, a semiconductor memory device having a function of correcting a defective bit by using a code which enables correction of a single-bit error and is constituted by data corresponding to successive addresses in an address range designated for a burst-mode operation is provided. The semiconductor memory device comprises memory cells; and a holding circuit which is arranged outside the memory cells, and holds one or both of at least a portion of a first set of data bits and a set of parity bits, where the first set of data bits and the set of parity bits constitute the code and are written in the memory cells in the leading one of a plurality of write cycles included in a burst write operation so that the portion is written at an address of the memory cells, the set of parity bits is generated on the basis of the first set of data bits, and data bits and parity bits constituting the code are written in the memory cells in each of the plurality of write cycles. The semiconductor memory device also comprises a parity updating circuit which updates, in the final one of the plurality of write cycles in the burst write operation, the set of parity bits written in the memory cells in the leading one of the plurality of write cycles, on the basis of the one or both of the portion of the first set of data bits and the set of parity bits held by the holding circuit and a second set of data bits required to be written at the above address of the memory cells in the final one of the plurality of write cycles.

The above and other objects, features and advantages of the present invention will become apparent from the following description when taken in conjunction with the accompanying drawings which illustrate preferred embodiment of the present invention by way of example.

BRIEF DESCRIPTION OF THE DRAWINGS

FIG. 11 is a diagram illustrating data bits used for generation of parity bits in an example of an ECC code in which seven parity bits are generated for 64 data bits.

FIGS. 12A, 12B, 12C, 12D, 12E, 12F, and 12G are diagrams of circuits for generating parity bits in the ECC code indicated in FIG. 11.

FIG. 13 is a diagram illustrating data bits used for generation of block-based parity bits in an example of an ECC code in which seven block-based parity bits are generated for 16 data bits.

DESCRIPTION OF THE PREFERRED EMBODIMENTS

Preferred embodiments of the present invention will be explained below with reference to the accompanying drawings, wherein like reference numbers refer to like elements throughout.

The semiconductor memory devices according to the embodiments explained below have an ECC function. In order to compose an ECC code for one-bit-error correction, 4 parity bits for 8 data bits, 5 parity bits for 16 data bits, 7 parity bits for 64 data bits, and 8 parity bits for 128 data bits are necessary. In the examples used in the following explanations, the ECC code is composed of 64 data bits and seven parity bits.

First Embodiment

Figure 1:
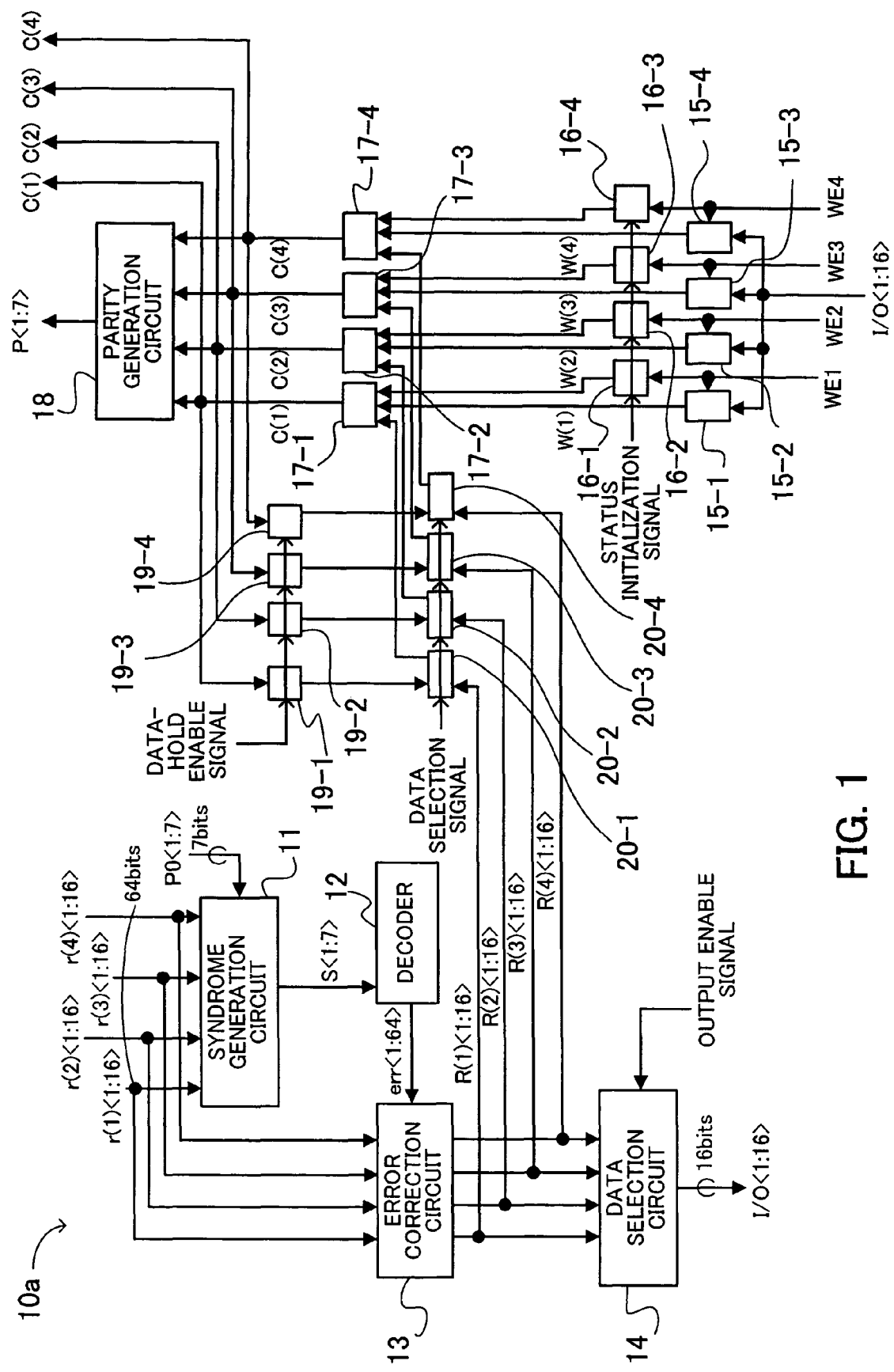
FIG. 1 is a block diagram of circuitry in a semiconductor memory device according to a first embodiment of the present invention.

FIG. 1 is a block diagram of circuitry in a semiconductor memory device according to the first embodiment of the present invention. As the conventional semiconductor memory device 800, the semiconductor memory device 10a illustrated in FIG. 1 comprises a syndrome generation circuit 11, a decoder 12, an error correction circuit 13, a data selection circuit 14, write-data holding circuits 15-1, 15-2, 15-3, and 15-4, write-status holding circuits 16-1, 16-2, 16-3, and 16-4, read/write data selection circuits 17-1, 17-2, 17-3, and 17-4, and a parity generation circuit 18. In addition, the semiconductor memory device 10a is characterized in comprising selected-data holding circuits 19-1, 19-2, 19-3, and 19-4, and selection circuits 20-1, 20-2, 20-3, and 20-4.

The syndrome generation circuit 11 generates a 7-bit syndrome signal S on the basis of an ECC code constituted by read-data pieces r(1), r(2), r(3), and r(4) and a set of seven parity bits P0 corresponding to the read-data pieces r(1), r(2), r(3), and r(4). The read-data pieces r(1), r(2), r(3), and r(4) and the set of seven parity bits P0 are read out from memory cells. Each of the read-data pieces r(1), r(2), r(3), and r(4) is constituted by 16 bits, and thus the total number of bits of the read-data pieces r(1), r(2), r(3), and r(4) is 64.

The decoder 12 decodes the syndrome signal S, and generates 64-bit error correction flags err.

The error correction circuit 13 is constituted by, for example, ExOR (exclusive OR) circuits, receives the read-data pieces r(1), r(2), r(3), and r(4) and the error correction flags err, corrects (inverts) a bit of the read-data pieces r(1), r(2), r(3), and r(4) corresponding to one of the error correction flags err when the one of the error correction flags err is valid, and outputs corrected read-data pieces R(1), R(2), R(3), and R(4).

The data selection circuit 14 performs parallel-to-serial conversion of 64-bit data outputted from the memory cells, into 16-bit form for outputting the converted data through 16-bit I/O ports, in response to an output enable signal, which is designated by an input address.

The write-data holding circuits 15-1, 15-2, 15-3, and 15-4 capture 16-bit write-data pieces (i.e., data to be written in the memory cells) inputted from the I/O ports in turn in response to write enable signals WE1, WE2, WE3, and WE4, respectively, and hold the captured write-data pieces as write-data pieces W(1), W(2), W(3), and W(4). The write-status holding circuits 16-1, 16-2, 16-3, and 16-4 determine whether or not the captured write-data pieces are to be written in the memory cells, in response to a status initialization signal.

Each read/write data selection circuit 17-i determines one of the write-data piece W(i) and the corrected read-data piece R(i) as a data piece C (i) which is to be written in the memory cells, according to a signal outputted from the corresponding write-status holding circuit 16-i, and the parity generation circuit 18 receives the data piece C(i) determined by the read/write data selection circuit 17-i, generates a set of seven parity bits P on the basis of the received data piece C(i), and outputs the set of seven parity bits P, where $1 \leq i \leq 4$.

The selected-data holding circuits 19-1, 19-2, 19-3, and 19-4 hold the data pieces C(1) to C(4) written in the memory cells, in response to a data-hold enable signal.

Each selection circuit 20-i selects one of the data piece outputted from the corresponding selected-data holding circuit 19-i and the corrected read-data piece R(i), in response to a data selection signal, and supplies the selected one to the corresponding read/write data selection circuit 17-i, where $1 \leq i \leq 4$.

Hereinbelow, the burst-mode operation of the semiconductor memory device 10a according to the first embodiment is explained.

First, the burst read operation is briefly explained below.

In each burst read cycle, the read-data pieces r(1) to r(4) are read out from the memory cells in one clock cycle, where each of the read-data pieces r(1) to r(4) is constituted by 16 bits. The syndrome generation circuit 11 generates a 7-bit syndrome signal S on the basis of the read-data pieces r(1), r(2), r(3), and r(4) and a set of seven parity bits P0 corresponding to the read-data pieces r(1), r(2), r(3), and r(4). The decoder 12 decodes the syndrome signal S, and generates the 64-bit error correction flags err. The error correction circuit 13 receives the read-data pieces r(1), r(2), r(3), and r(4) and the error correction flags err generated on the basis of the read-data pieces r(1), r(2), r(3), and r(4), corrects (inverts) a bit of the read-data pieces r(1), r(2), r(3), and r(4) corresponding to one of the error correction flags err when the one of the error correction flags err is valid, and outputs corrected read-data pieces R(1), R(2), R(3), and R(4), where each of the corrected read-data pieces R(1) to R(4) is constituted by 16 bits. The data selection circuit 14 performs parallel-to-serial conversion of 64-bit data outputted from the memory cells, into 16-bit form, in response to the output enable signal, so that the converted data are outputted in turn through the 16-bit I/O ports. In the case where the burst length BL is eight, the burst read operations as above are performed in two burst read cycles. In the second burst read cycle following the first burst read cycle, data stored in the addresses following the address of the above read-data pieces r(1) to r(4) read out in the first burst read cycle are similarly read out as the next read-data pieces r(1) to r(4). Then, error correction is made, and the corrected read data are outputted.

Next, the burst write operation is briefly explained below.

In the following explanations, it is assumed that the burst length (BL) is eight, and the size of the write block is 16 bits. In this case, the 64-bit data corresponding to the successive addresses A(1) to A(4), or A(5) to A(8) constitute the ECC code. In the construction of FIG. 1, the ECC code is composed by writing the data pieces C(1) to C(4) in the addresses A(1) to A(4), or A(5) to A(8).

Figure 19:
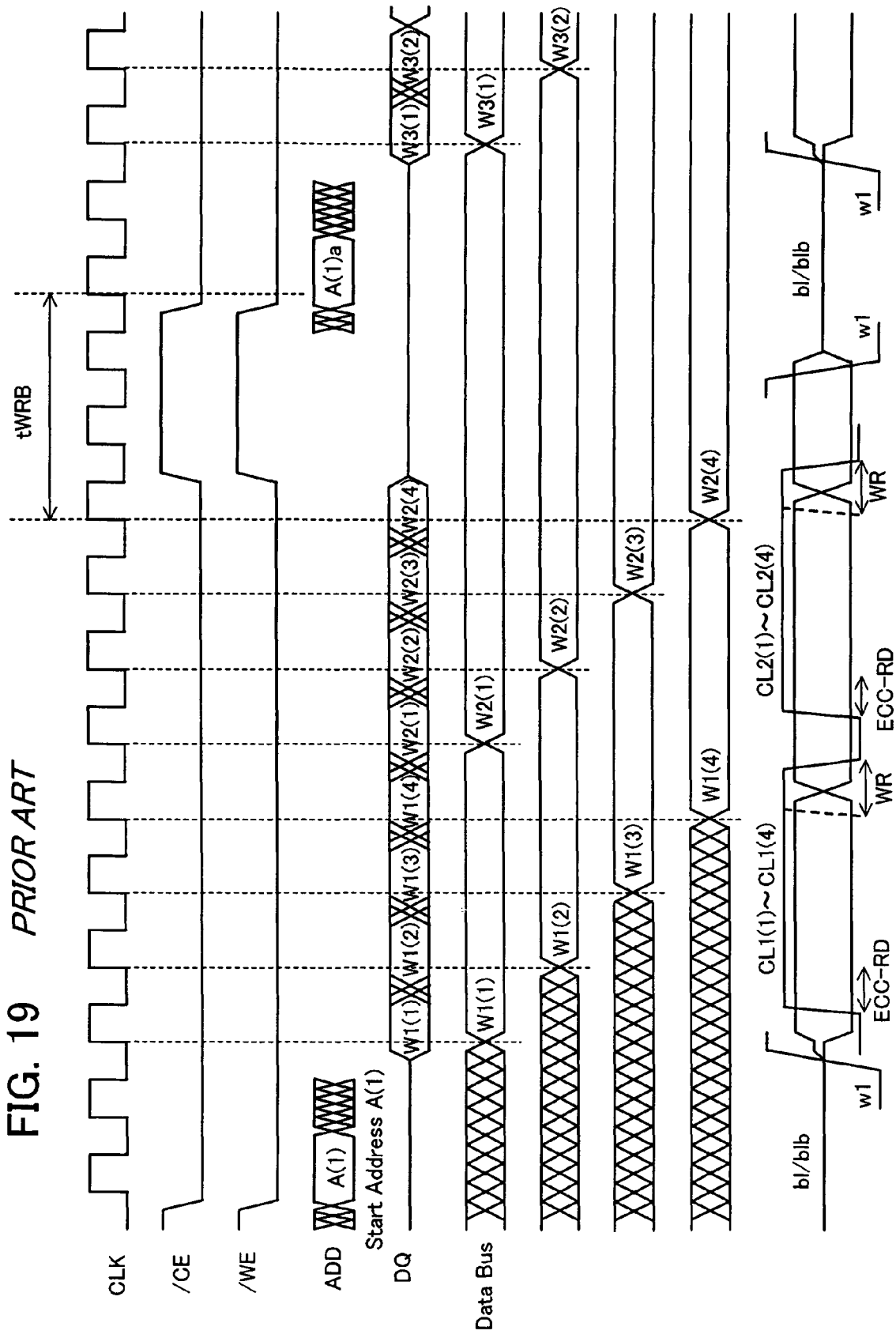
FIG. 19 is a timing diagram of signals in a burst-mode (write) operation performed in the conventional semiconductor memory device of FIG. 18 in the case where the start address is A(1).
Figure 20:
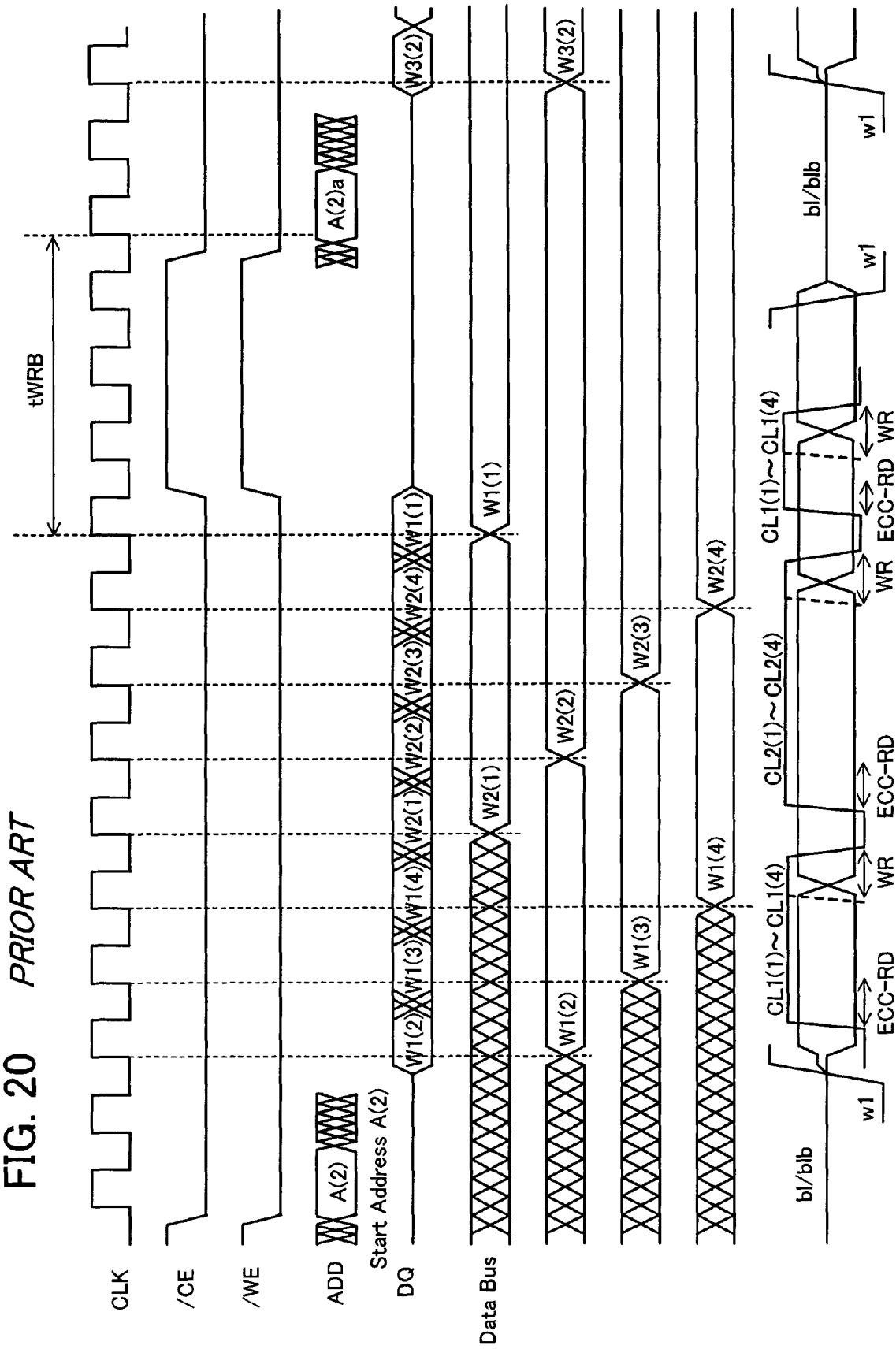
FIG. 20 is a timing diagram of signals in a burst-mode (write) operation performed in the conventional semiconductor memory device of FIG. 18 in the case where the start address is A(2).
Figure 21:
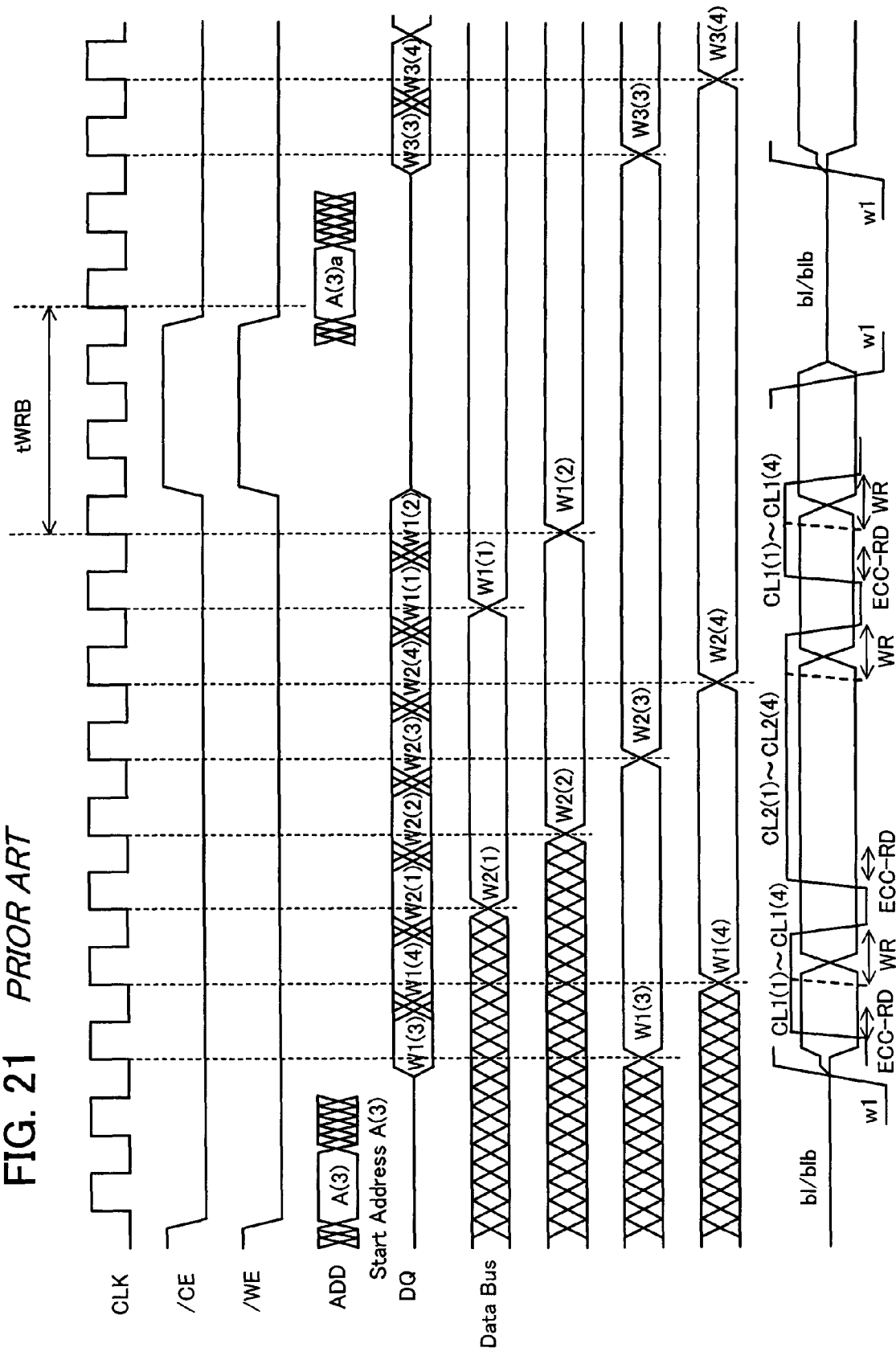
FIG. 21 is a timing diagram of signals in a burst-mode (write) operation performed in the conventional semiconductor memory device of FIG. 18 in the case where the start address is A(3).

In the case where the start address in the burst write operation is A(1), A(5), A(3), A(4), A(7), or A(8), the write recovery time (tWRB) increases (deteriorates) little as explained before with reference to FIGS. 19 and 21. Therefore, in these cases, the selected-data holding circuits 19-1, 19-2, 19-3, and 19-4 do not hold the data C(1) to C(4) to be written in the memory cells, and the selection circuits 20-1, 20-2, 20-3, and 20-4 select the corrected read-data pieces R(1) to R(4), and supplies the corrected read-data pieces R(1) to R(4) to the read/write data selection circuits 17-1, 17-2, 17-3, and 17-4, respectively. Thus, the burst write operations performed in the semiconductor memory device 10a in the case where the start address in the burst write operation is A(1), A(5), A(3), A(4), A(7), or A(8) are similar to the operations of FIGS. 19 and 21 performed in the conventional semiconductor memory device 800.

On the other hand, in the case where the start address is A(2) or A(6) in the semiconductor memory device 10a, the burst write operation is performed as explained below. Since the burst write operations in the cases where the start address is A(2) and A(6) are basically similar, only the case where the start address is A(2) are explained below.

Figure 2:
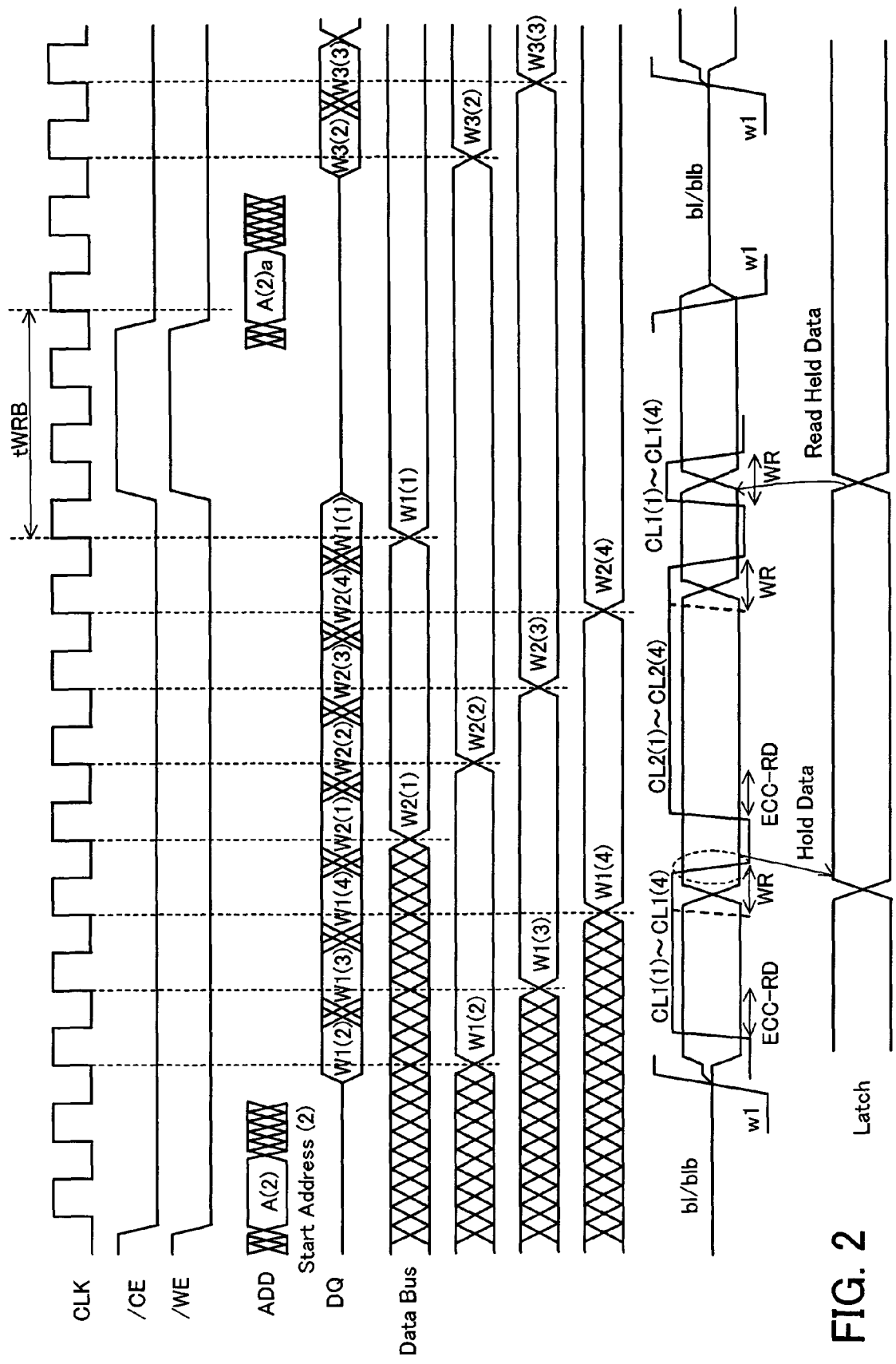
FIG. 2 is a timing diagram of signals in a burst write operation performed in the semiconductor memory device according to the first embodiment in the case where the start address is A(2).

FIG. 2 is a timing diagram of signals in a burst write operation performed in the semiconductor memory device 10a according to the first embodiment in the case where the start address is A(2).

Figure 18:
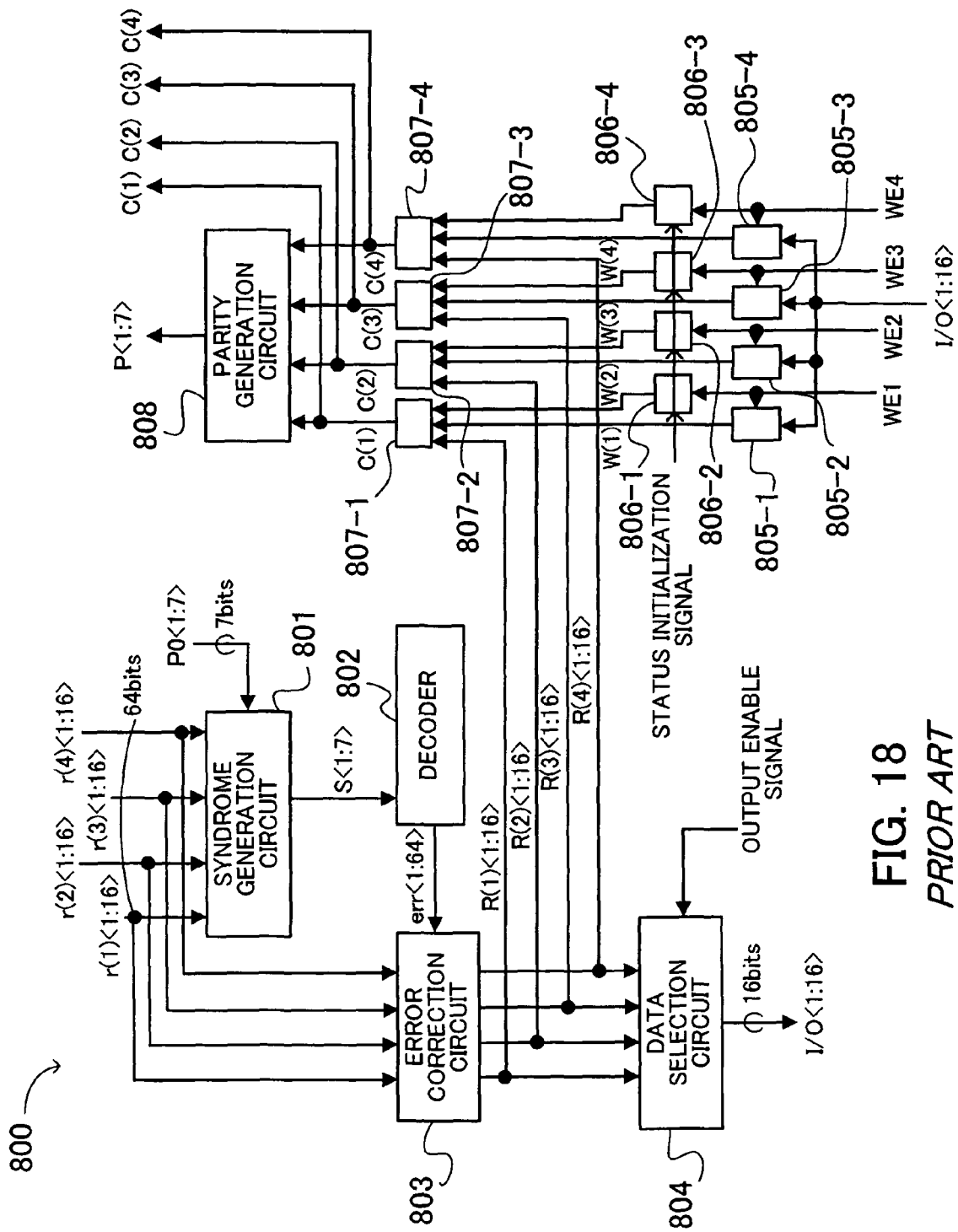
FIG. 18 is a block diagram of first circuitry realizing an ECC function and a burst-mode function in a conventional semiconductor memory device.

As in the case of FIG. 2, when a word line is selected in response to the start address, a voltage difference occurs between the pair of bit lines b1 and b1b, and a sense operation is started. At the times of the ECC-RD and write (WR) operations, the four column-selection signals CL1(1) to CL1(4) or the four column-selection signals CL2(1) to CL2(4) are active. Although not shown in FIG. 2, the address is sequentially incremented as A(2)→A(3)→A(4)→A(5)→A(6)→A(7)→A(8)→A(1). While the addresses are changed as above, the word-line selection address w1 is not changed. The data pieces to be written are captured in the order of W1(2)→W1(3)→W1(4)→W2(1)→W2(2)→W2(3)→W2(4)→W1(1). The data pieces to be written are respectively outputted on data buses being arranged between input terminals DQ and the memory cells and having the total width of 64 bits, and the data pieces on the data buses are changed one after another as W1(2)→W2(2), W1(3)→W2(3), W1(4)→W2(4), and W2(1)→W1(1). Even after the ECC-RD operation is completed, the four column-selection signals CL1(1) to CL1(4) or the four column-selection signals CL2(1) to CL2(4) are maintained active, and the data pieces outputted onto the data buses and constituted by 64 bits are written in the memory cells in each of the three write cycles in which the address is A(4), A(8), and A(1), respectively. In the first write cycle, in order to obtain a necessary number of data bits for generation of the set of parity bits P by the parity generation circuit 18, the corrected read-data piece R(1) (illustrated in FIG. 18) which corresponds to the address A(1) and is read out and corrected by the ECC-RD operation and the write-data pieces W1(2) to W1(4) are selected and written as the data pieces C(1) to C(4), although the corrected read-data pieces R(1) to R(4) and the data pieces C(1) to C(4) are not indicated in FIG. 2.

In the burst write operation with the start address A(2) in the semiconductor memory device 10a according to the first embodiment, the write-data pieces W1(2) to W1(4) and the corrected read-data piece R(1) which are written in the memory cells in the first write cycle are held as the data pieces C(1) to C(4) in the selected-data holding circuits 19-1, 19-2, 19-3, and 19-4.

In the second write cycle, the write-data pieces W2(1) to W2(4) are selected as the data pieces C(1) to C(4) and written in the memory cells after the ECC-RD operation, as in the conventional semiconductor memory device.

In the third write cycle (i.e., in the final write cycle in the burst write operation), the data held by the selected-data holding circuits 19-1, 19-2, 19-3, and 19-4 are read out. That is, each selection circuit 20-$i$ selects the data piece held by the corresponding selected-data holding circuit 19-$i$ (instead of the corrected read-data piece R(i)), and supplies the selected data piece to the corresponding read/write data selection circuit 17-$i$, where $1 \leq i \leq 4$. Then, the read/write data selection circuit 17-1 selects as the data piece C(1) the write-data piece W1(1) corresponding to the address A(1) which is to be newly written, according to a signal outputted from the write-status holding circuit 16-1, and the other read/write data selection circuits 17-2, 17-3, and 17-4 select as the data pieces C(2) to C(4) the write-data pieces W1(2) to W1(4) held by the selected-data holding circuits 19-2, 19-3, and 19-4, according to signals outputted from the write-status holding circuits 16-2, 16-3, and 16-4. The data pieces C(1) to C(4) selected by the read/write data selection circuits 17-1, 17-2, 17-3, and 17-4 are inputted into the parity generation circuit 18, and are also written at the addresses A(1) to A(4) in the memory cells.

Hereinbelow, details of the generation of a set of parity bits are explained.

Figure 3:
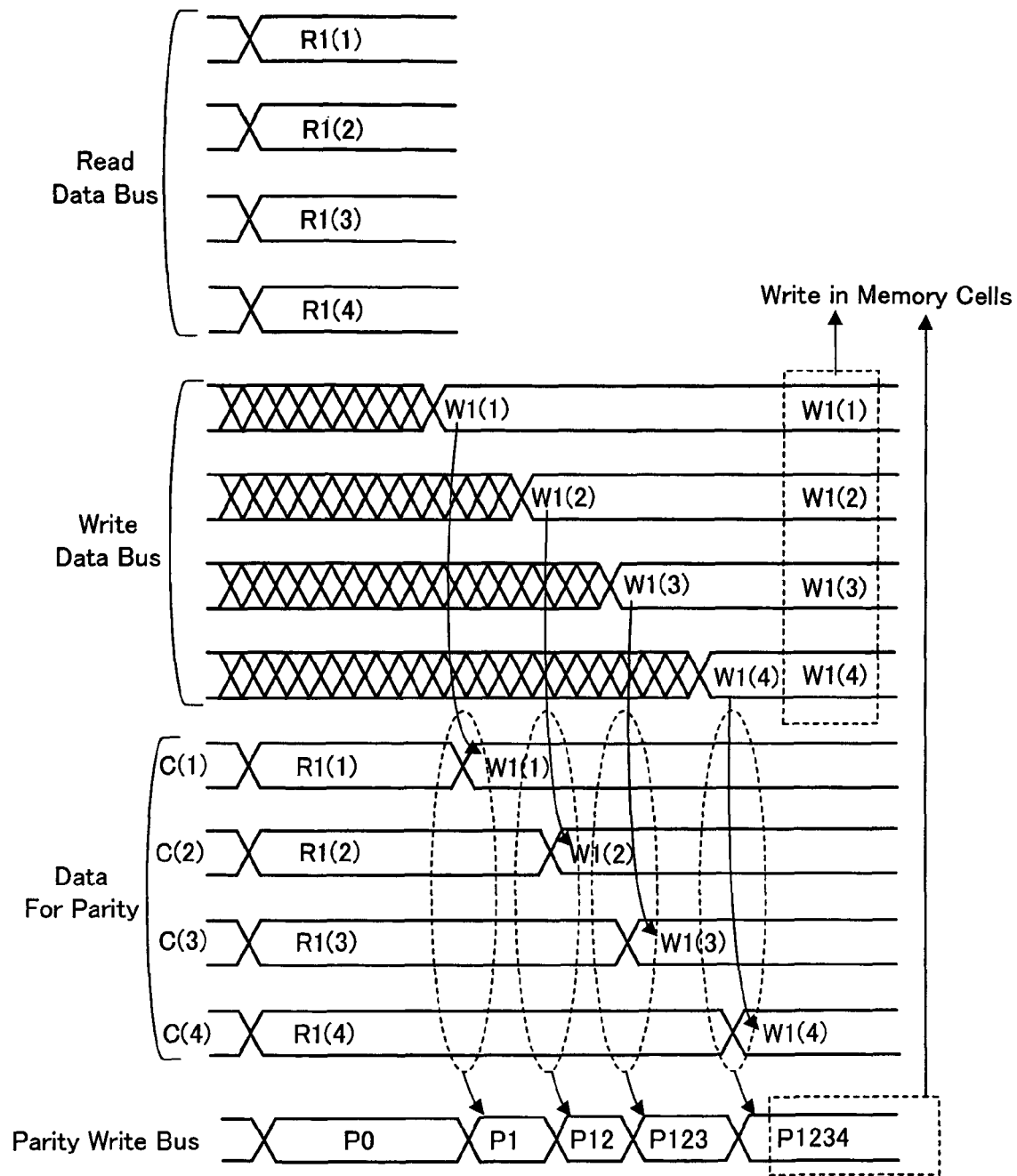
FIG. 3 is a timing diagram of signals in operations performed in the semiconductor memory device according to the first embodiment for generating a set of parity bits in the case where the start address is A(1).

FIG. 3 is a timing diagram of signals in operations performed in the semiconductor memory device 10a according to the first embodiment for generating a set of parity bits in the case where the start address is A(1).

In the case where the start address is A(1), the write operations are performed in two write cycles. The ECC-RD operation is performed before the first write cycle. In the ECC-RD operation, the corrected read-data pieces R1(1) to R1(4) (each constituted by 16 bits) are read out from the memory cells onto read-data buses, and are then selected by the selection circuits 20-1, 20-2, 20-3, and 20-4 and the read/write data selection circuits 17-1, 17-2, 17-3, and 17-4. The parity generation circuit 18 generates a set of parity bits P0 (constituted by 7 bits) on the basis of the corrected read-data pieces R1(1) to R1(4), so that the generated set of parity bits P0 is outputted on a parity-write bus. Thereafter, every time a new write-data piece is inputted, the selection by one of the read/write data selection circuits 17-1, 17-2, 17-3, and 17-4 corresponding to the inputted write-data piece is switched from one of the corrected read-data pieces R1(1) to R1(4) corresponding to the inputted write-data piece to the inputted write-data piece, and the parity generation circuit 18 newly generates a set of parity bits. For example, when the write-data piece W1(1) (constituted by 16 bits) is inputted onto a write-data bus, the data piece C(1) used for generation of parity bits is changed from the read-data piece R1(1) to the write-data piece W1(1), and the parity generation circuit 18 generates a set of parity bits P1 on the basis of the write-data piece W1(1) and the read-data pieces R1(2) to R1(4), so that the generated set of parity bits P1 is outputted on the parity-write bus. Similarly, when each of the write-data pieces W1(2), W1(3), and W1(4), which are inputted one after another, is inputted, the parity generation circuit 18 successively generates a new set of parity bits in the order of P1→P12→P123→P1234. Thus, when all of the write-data pieces W1(2), W1(3), and W1(4) are inputted onto write-data buses, the set of parity bits P1234 is finally outputted on the parity-write bus, so that the write-data pieces W1(1) to W1(4) and the set of parity bits P1234 are written in the memory cells. Although not shown in FIG. 3, the write operation in the second write cycle is performed in a similar manner to the first write cycle, so that write-data pieces and a set of parity bits generated on the basis of the write-data pieces are written in the memory cells. Thus, the burst write operation with the burst length (BL) of eight is completed.

Figure 4:
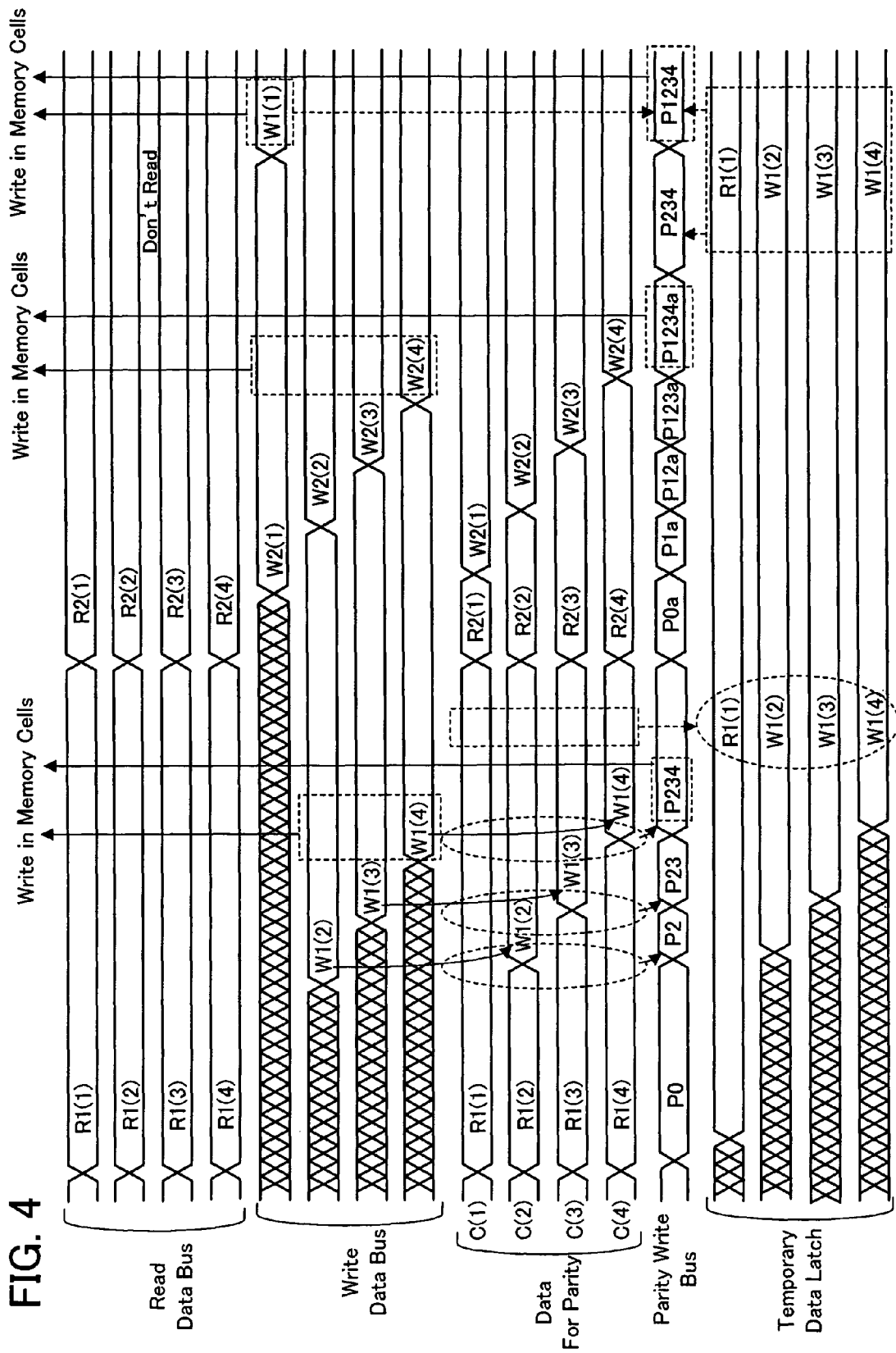
FIG. 4 is a timing diagram of signals in operations performed in the semiconductor memory device according to the first embodiment for generating a set of parity bits in the case where the start address is A(2).

FIG. 4 is a timing diagram of signals in operations performed in the semiconductor memory device 10a according to the first embodiment for generating a set of parity bits in the case where the start address is A(2).

In the case where the start address is A(2), the write operations are performed in three write cycles. First, the ECC-RD operation is performed. As in the case of FIG. 3, in the ECC-RD operation, the corrected read-data pieces R1(1) to R1(4) (each constituted by 16 bits) are read out from the memory cells onto read-data buses, and are then selected by the selection circuits 20-1, 20-2, 20-3, and 20-4 and the read/write data selection circuits 17-1, 17-2, 17-3, and 17-4. The parity generation circuit 18 generates a set of parity bits P0 (constituted by 7 bits) on the basis of the corrected read-data pieces R1(1) to R1(4), so that the generated set of parity bits P0 is outputted on the parity-write bus. Thereafter, every time a new write-data piece is inputted, the selection by one of the read/write data selection circuits 17-1, 17-2, 17-3, and 17-4 corresponding to the inputted write-data piece is switched from one of the corrected read-data pieces R1(1) to R1(4) corresponding to the inputted write-data piece to the inputted write-data piece, and the parity generation circuit 18 newly generates a set of parity bits. For example, when the write-data piece W1(2) (constituted by 16 bits) is inputted onto a write-data bus, the data piece C(2) used for generation of a set of parity bits is changed from the read-data piece R1(2) to the write-data piece W1(2), and the parity generation circuit 18 generates a set of parity bits P2 on the basis of the write-data piece W1(2) and the corrected read-data pieces R1(1), R1(3), and R1(4), so that the generated set of parity bits P2 is outputted on the parity-write bus. Similarly, when each of the write-data pieces W1(3) and W1(4), which are inputted one after another, is inputted, the parity generation circuit 18 successively generates a new set of parity bits in the order of P2→P23→P234. Thus, when both the write-data pieces W1(3) and W1(4) are inputted onto the write-data buses, the set of parity bits P234 is finally outputted on the parity-write bus, so that the corrected read-data piece R1(1) and the write-data pieces W1(2) to W1(4) are selected as the data pieces C(1) to C(4), and written in the memory cells together with the set of parity bits P234.

In addition, in the semiconductor memory device 10a according to the first embodiment, the selected-data holding circuits 19-1, 19-2, 19-3, and 19-4 temporarily hold the data pieces C(1) to C(4) which are written in the memory cells (i.e., the corrected read-data piece R1(1) and the write-data pieces W1(2) to W1(4)) in the first write cycle. The operations in the second write cycle are performed while the data pieces C(1) to C(4) written in the first write cycle are held by the selected-data holding circuits 19-1, 19-2, 19-3, and 19-4.

In the second write cycle, the ECC-RD operation is performed as in the first write cycle, so that the corrected read-data pieces R2(1) to R2(4) are read out from the memory cells onto the read-data buses. Then, the corrected read-data pieces R2(1) to R2(4) are selected by the selection circuits 20-1, 20-2, 20-3, and 20-4 and the read/write data selection circuits 17-1, 17-2, 17-3, and 17-4, and the parity generation circuit 18 generates a set of parity bits P0a on the basis of the corrected read-data pieces R2(1) to R2(4), so that the generated set of parity bits P0a is outputted on the parity-write bus. When each of the write-data pieces, which are inputted one after another, is inputted, the selection by one of the read/write data selection circuits 17-1, 17-2, 17-3, and 17-4 corresponding to the inputted write-data piece is switched from one of the corrected read-data pieces R2(1) to R2(4) corresponding to the inputted write-data piece to the inputted write-data piece, and the parity generation circuit 18 successively generates a new set of parity bits in the order of P1a→P12a→P123a→P1234a. Thus, when all of the write-data pieces W2(1) to W2(4) are inputted onto write-data buses, the set of parity bits P1234a is finally outputted on the parity-write bus, and the write-data pieces W2(1) to W2(4) are selected as the data pieces C(1) to C(4), so that the selected write-data pieces W2(1) to W2(4) and the set of parity bits P1234a are written in the memory cells.

In the third write cycle, the selection circuits 20-1, 20-2, 20-3, and 20-4 select the corrected read-data piece R1(1) and the write-data pieces W1(2) to W1(4) which are held by the selected-data holding circuits 19-1, 19-2, 19-3, and 19-4, and supply the corrected read-data piece R1(1) and the write-data pieces W1(2) to W1(4) to the read/write data selection circuits 17-1, 17-2, 17-3, and 17-4, which also select the corrected read-data piece R1(1) and the write-data pieces W1(2) to W1(4). Then, the parity generation circuit 18 generates a set of parity bits P234 on the basis of the corrected read-data piece R1(1) and the write-data pieces W1(2) to W1(4). When the write-data piece W1(1) to be written at the address A(1) is inputted in the above situation, the write-data holding circuit 15-1 captures the write-data piece W1(1), and supplies the write-data piece W1(1) to the read/write data selection circuit 17-1. The read/write data selection circuit 17-1 selects the write-data piece W1(1) instead of the read-data piece R1(1) held by the selected-data holding circuit 19-1, and supplies the write-data piece W1(1) to the parity generation circuit 18. Then, the parity generation circuit 18 generates a set of parity bits P1234 on the basis of the write-data piece W1(1) and the write-data pieces W1(2) to W1(4) held by the selected-data holding circuits 19-2, 19-3, and 19-4 so that the generated set of parity bits P1234 is outputted on the parity-write bus, which is written in the memory cells together with the write-data pieces W1(1) to W1(4). Thus, the burst write operation with the burst length (BL) of eight is completed.

Further, the same column-selection signals CL1(1) to CL1(4) are activated in the first and third write cycles as indicated in FIG. 2.

Figure 5:
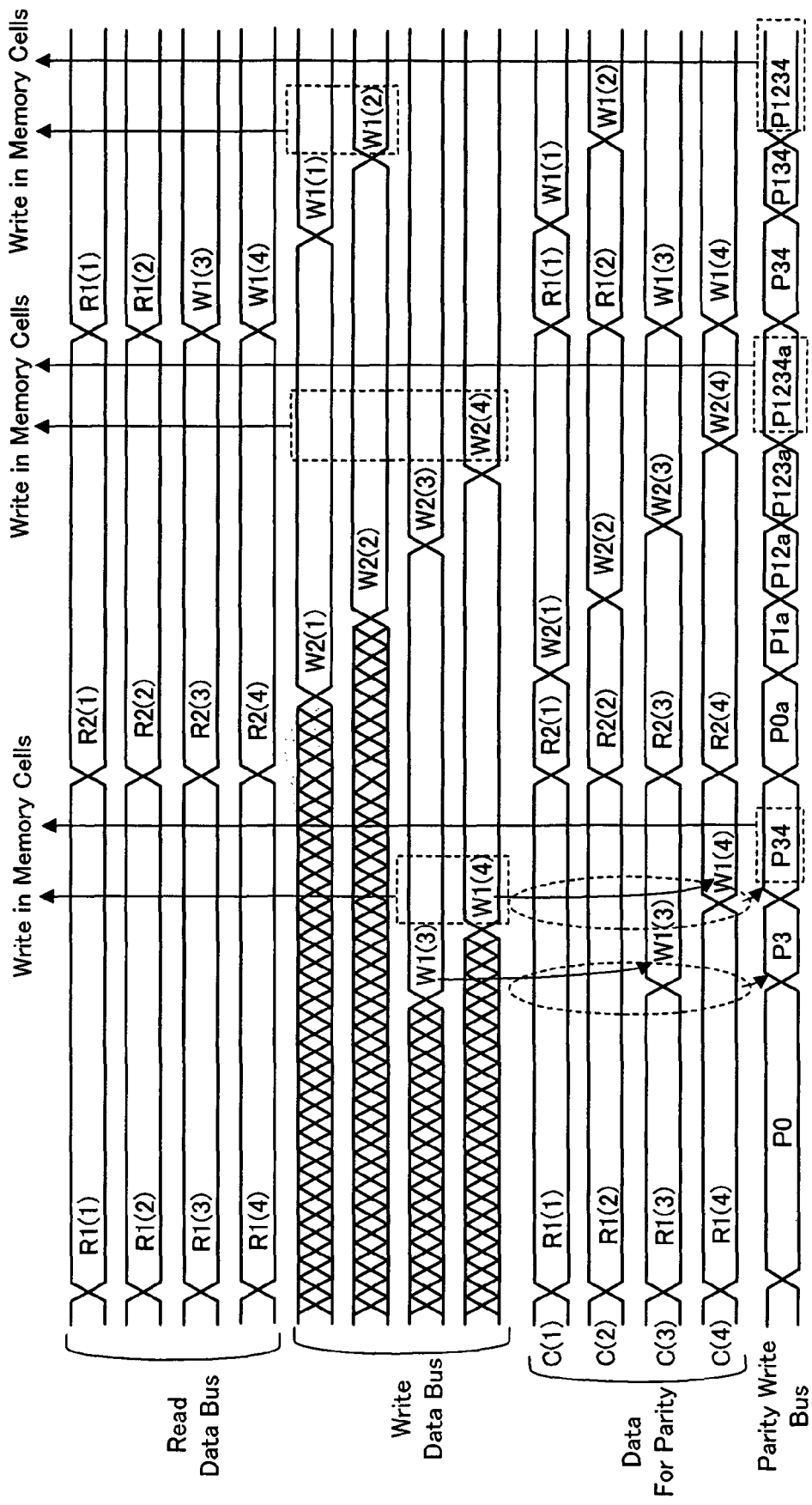
FIG. 5 is a timing diagram of signals in operations performed in the semiconductor memory device according to the first embodiment for generating a set of parity bits in the case where the start address is A(3).

FIG. 5 is a timing diagram of signals in operations performed in the semiconductor memory device according to the first embodiment for generating a set of parity bits in the case where the start address is A(3).

In the case where the start address is A(3), the write operations are performed in three write cycles. First, the ECC-RD operation is performed. In the ECC-RD operation, the corrected read-data pieces R1(1) to R1(4) (each constituted by 16 bits) are read out from the memory cells onto read-data buses, and are then selected by the selection circuits 20-1, 20-2, 20-3, and 20-4 and the read/write data selection circuits 17-1, 17-2, 17-3, and 17-4. The parity generation circuit 18 generates a set of parity bits P0 (constituted by 7 bits) on the basis of the corrected read-data pieces R1(1) to R1(4), so that the generated set of parity bits P0 is outputted on the parity-write bus. Thereafter, every time a new write-data piece is inputted, the selection by one of the read/write data selection circuits 17-1, 17-2, 17-3, and 17-4 corresponding to the inputted write-data piece is switched from one of the corrected read-data pieces R1(1) to R1(4) corresponding to the inputted write-data piece to the inputted write-data piece, and the parity generation circuit 18 newly generates a set of parity bits. For example, when the write-data piece W1(3) (constituted by 16 bits) is inputted onto a write-data bus, the data piece C(3) used for generation of a set of parity bits is changed from the read-data piece R1(3) to the write-data piece W1(3), and the parity generation circuit 18 generates a set of parity bits P3 on the basis of the write-data piece W1(3) and the corrected read-data pieces R1(1), R1(2), and R1(4), so that the generated set of parity bits P3 is outputted on the parity-write bus. Similarly, when the write-data pieces W1(4) is inputted, the parity generation circuit 18 newly generates a set of parity bits P34. Thus, when both the write-data pieces W1(3) and W1(4) are inputted onto the write-data buses, the set of parity bits P34 is finally outputted on the parity-write bus, so that the corrected read-data pieces R1(1) and R1(2) and the write-data pieces W1(3) and W1(4) are selected as the data pieces C(1) to C(4), and written in the memory cells together with the set of parity bits P34.

The write operation in the second write cycle is performed in a similar manner to the first write cycle, so that write-data pieces W2(1) to W2(4) and a set of parity bits P1234a generated on the basis of the write-data pieces are written in the memory cells.

In the third write cycle, first, the ECC-RD operation is performed as in the first write cycle, so that the corrected read-data pieces R1(1) and R1(2) and the write-data pieces W1(3) and W1(4) (each constituted by 16 bits) are read out from the memory cells onto the read-data buses, where the write-data pieces W1(3) and W1(4) are written in the memory cells in the first write cycle. Then, the corrected read-data pieces R1(1) and R1(2) and the write-data pieces W1(3) and W1(4) are selected by the selection circuits 20-1, 20-2, 20-3, and 20-4 and the read/write data selection circuits 17-1, 17-2, 17-3, and 17-4, and the parity generation circuit 18 generates a set of parity bits P34 on the basis of the corrected read-data pieces R1(1) and R1(2) and the write-data pieces W1(3) and W1(4), so that the generated set of parity bits P34 is outputted on the parity-write bus. Thereafter, every time a new write-data piece is inputted, the selection by one of the read/write data selection circuits 17-1, 17-2, 17-3, and 17-4 corresponding to the inputted write-data piece is switched from one of the corrected read-data pieces R1(1) to R1(4) corresponding to the inputted write-data piece to the inputted write-data piece, and the parity generation circuit 18 newly generates a set of parity bits. For example, when the write-data piece W1(1) is inputted, the data piece C(1) is switched from the corrected read-data piece R1(1) to R1(4) to the inputted write-data piece W1(1), and the parity generation circuit 18 newly generates a set of parity bits P134. Similarly, when the write-data piece W1(2) is inputted, the parity generation circuit 18 newly generates a set of parity bits P1234, so that the generated set of parity bits P1234 is finally outputted on the parity-write bus. Therefore, the write-data pieces W1(1) to W1(4) are selected as the data pieces C(1) to C(4), and the write-data pieces W1(1) to W1(4) and the set of parity bits P1234 are written in the memory cells. Thus, the burst write operation with the burst length (BL) of eight is completed.

Further, the same column-selection signals CL1(1) to CL1 (4) are activated in the first and third write cycles as indicated in FIG. 2.

As explained above, in the semiconductor memory device 10a according to the first embodiment, when the start address in a burst write operation is A(2), the data pieces C(1) to C(4) which have the total bit length of 64 bits and are first written in the memory cells are held by the selected-data holding circuits 19-1, 19-2, 19-3, and 19-4 in the first write cycle, and are thereafter used in the final write cycle for generation of a set of parity bits. Therefore, in the semiconductor memory device 10a according to the first embodiment, access to the memory core for the ECC-RD operation is unnecessary in the final write cycle, and thus increase in the write recovery time (tWRB) can be prevented, although, in the conventional semiconductor memory device, the ECC-RD operation in the final write cycle is necessary in the case where the start address is A(2), and increases the write recovery time (tWRB).

Second Embodiment

Figure 6:
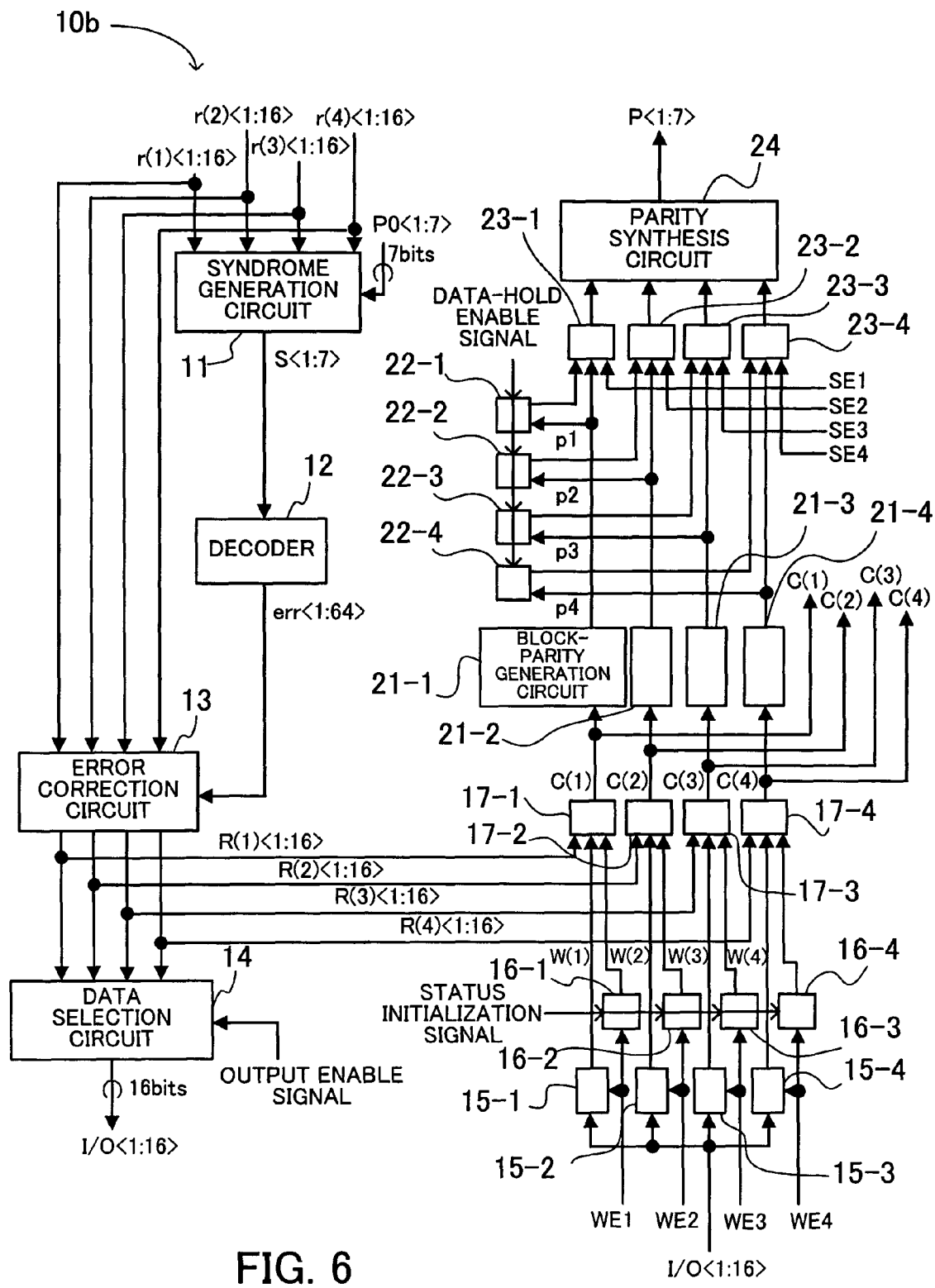
FIG. 6 is a block diagram of circuitry in a semiconductor memory device according to a second embodiment of the present invention.

FIG. 6 is a block diagram of circuitry in a semiconductor memory device according to the second embodiment of the present invention. The semiconductor memory device 10b illustrated in FIG. 6 is different from the semiconductor memory device 10a according to the first embodiment in comprising block-parity generation circuits 21-1, 21-2, 21-3, and 21-4, block-parity holding circuits 22-1, 22-2, 22-3, and 22-4, comparison circuits 23-1, 23-2, 23-3, and 23-4, and a parity synthesis circuit 24.

The block-parity generation circuits 21-1, 21-2, 21-3, and 21-4 respectively generate sets of block-based parity bits p1, p2, p3, and p4 on the basis of 16-bit data pieces C(1) to C(4), where each of the 16-bit data pieces C(1) to C(4) corresponds to the minimum unit of data written in the memory cells (which are not shown). For example, each of the sets of block-based parity bits p1, p2, p3, and p4 is constituted by seven bits.

The block-parity holding circuits 22-1, 22-2, 22-3, and 22-4 respectively capture and hold the sets of block-based parity bits p1, p2, p3, and p4 in response to a data-hold enable signal.

Each of the comparison circuits 23-i is constituted by, for example, at least one ExOR (exclusive OR) circuit, compares the corresponding set of block-based parity bits pi generated by the corresponding block-parity generation circuit 21-i, with the corresponding set of block-based parity bits held by the corresponding block-parity holding circuit 22-i, inverts one or more bits of the set of block-based parity bits held by the corresponding block-parity holding circuit 22-i when the one or more bits in the corresponding block-parity holding circuit 22-i are different from one or more corresponding bits of the set of block-based parity bits pi generated by the corresponding block-parity generation circuit 21-i, selects and outputs the above set of block-based parity bits which are originated from the block-parity holding circuit 22-i, after the inversion of the one or more bits as above when the inversion is performed, or the corresponding set of block-based parity bits pi generated by the corresponding block-parity generation circuit 21-i, according to the corresponding one of selection signals SE1, SE2, SE3, and SE4, where $1 \leq i \leq 4$.

The parity synthesis circuit 24 generates a set of parity bits P by synthesizing the sets of block-based parity bits outputted from the comparison circuits 23-1, 23-2, 23-3, and 23-4.

Hereinbelow, the operations of the semiconductor memory device 10b according to the second embodiment are explained. In the following explanations, it is assumed that the burst length (BL) is eight, and the size of the write block is 16 bits, as in the semiconductor memory device 10a according to the first embodiment. In this case, the 64-bit data corresponding to the successive addresses A(1) to A(4), or A(5) to A(8) constitute an ECC code.

In the case where the start address in a burst write operation is A(1), A(5), A(3), A(4), A(7), or A(8), the write recovery time (tWRB) increases (deteriorates) little as explained before with reference to FIGS. 19 and 21. Therefore, in these cases, the block-parity holding circuits 22-1, 22-2, 22-3, and 22-4 do not hold the sets of block-based parity bits p1, p2, p3, and p4, and the comparison circuits 23-1, 23-2, 23-3, and 23-4 respectively select the sets of block-based parity bits supplied from the block-parity generation circuits 21-1, 21-2, 21-3, and 21-4, and supply the selected sets of block-based parity bits to the parity synthesis circuit 24. Thus, in the case where the start address is A(1), A(5), A(3), A(4), A(7), or A(8), the semiconductor memory device 10b according to the second embodiment operates in a similar manner to the conventional semiconductor memory device 800 as explained before with reference to FIGS. 19 and 21.

In the case where the start address in a burst write operation is A(2) or A(6), the burst write operation is performed as explained below.

As explained before with reference to FIG. 2, in the semiconductor memory device 10a according to the first embodiment, the data pieces C(1) to C(4) which are written in the first write cycle in the memory cells and have the total length of 64 bits are held, and a set of parity bits is generated in the third write cycle by using the data pieces C(1) to C(4) held in the first write cycle. On the other hand, in the semiconductor memory device 10b according to the second embodiment, the sets of block-based parity bits respectively generated on the basis of the data pieces C(1) to C(4) which are written in the memory cells in the first write cycle are held, and a set of parity bit P to be written in the memory cells is updated by using the difference between the sets of block-based parity bits held in the first write cycle and sets of block-based parity bits generated on the basis of a write-data piece W(1).

Specifically, in the first write cycle, four sets of block-based parity bits p1, p2, p3, and p4 are generated by the block-parity generation circuits 21-1, 21-2, 21-3, and 21-4 on the basis of the 16-bit data pieces C(1) to C(4) selected by the read/write data selection circuits 17-1, 17-2, 17-3, and 17-4, respectively. (Hereinafter, the four sets of block-based parity bits p1, p2, p3, and p4 generated in the first write cycle are denoted by the references p1-1, p2-1, p3-1, and p4-1.) Then, the sets of block-based parity bits p1-1, p2-1, p3-1, and p4-1 are respectively held by the block-parity holding circuits 22-1, 22-2, 22-3, and 22-4.

In the third write cycle, the ECC-RD operation is not performed, and new sets of block-based parity bits p1-2, p2-2, p3-2, and p4-2 are generated by using the write-data piece W(1) which is newly captured. The comparison circuits 23-1, 23-2, 23-3, and 23-4 compare the sets of block-based parity bits p1-2, p2-2, p3-2, and p4-2 with the sets of block-based parity bits p1-1, p2-1, p3-1, and p4-1, respectively. Each comparison circuit 23-i inverts one or more bits of the corresponding set of block-based parity bits pi-1 when the one or more bits of the corresponding set of block-based parity bits pi-1 are different from one or more corresponding bits of the set of block-based parity bits pi-2, and outputs the above set of block-based parity bits pi-1, after the inversion of the one or more bits as above: when the inversion is performed, where $1 \leq i \leq 4$. The parity synthesis circuit 24 synthesizes the sets of block-based parity bits outputted from the comparison circuits 23-1, 23-2, 23-3, and 23-4, into a set of seven parity bits P, so that the set of seven parity bits P are written in the memory cells together with the data pieces C(1) to C(4).

As explained above, the semiconductor memory device 10b according to the second embodiment operate in an approximately similar to the semiconductor memory device 10a according to the first embodiment except that the sets of block-based parity bits, instead of the data pieces C(1) to C(4), are held in the first write cycle. Since the circuit size necessary for the storage of the sets of block-based parity bits p1, p2, p3, and p4 (constituted by, for example, 7×4=28 bits) is smaller than the circuit size necessary for the storage of the data pieces C(1) to C(4) (constituted by, for example, 64 bits), the semiconductor memory device 10b according to the second embodiment can be realized with a smaller circuit size than the semiconductor memory device 10a according to the first embodiment.

Third Embodiment

Figure 7:
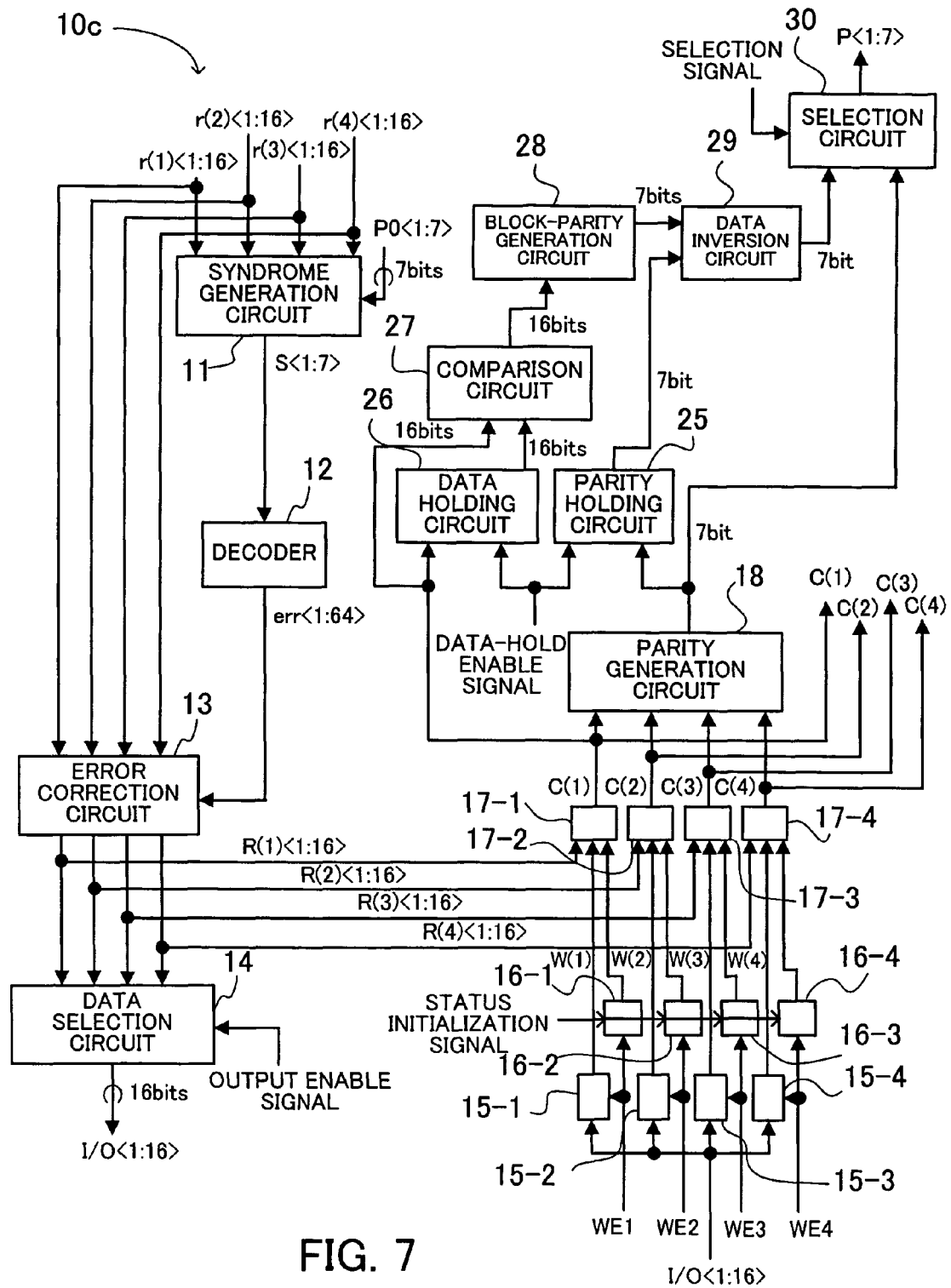
FIG. 7 is a block diagram of circuitry in a semiconductor memory device according to a third embodiment of the present invention.

FIG. 7 is a block diagram of circuitry in a semiconductor memory device according to the third embodiment of the present invention. The semiconductor memory device 10c illustrated in FIG. 7 is different from the semiconductor memory device 10a according to the first embodiment in comprising a parity holding circuit 25, a data holding circuit 26, a comparison circuit 27, a block-parity generation circuit 28, a data inversion circuit 29, and a selection circuit 30.

The parity holding circuit 25 captures and holds a set of seven parity bits generated by the parity generation circuit 18, in response to a data-hold enable signal, and the data holding circuit 26 holds a data piece C(1) selected by the read/write data selection circuit 17-1, in response to the data-hold enable signal. The data-hold enable signal makes the parity holding circuit 25 and the data holding circuit 26 hold the set of parity bits and the data piece C(1) in the first write cycle in each burst write operation.

The comparison circuit 27 is constituted by, for example, at least one ExOR circuit, compares the data piece held by the data holding circuit 26, with the data piece C(1) selected by the read/write data selection circuit 17-1. When one or more bits of the data piece held by the data holding circuit 26 are different from one or more corresponding bits of the data piece C(1) selected by the read/write data selection circuit 17-1, the comparison circuit 27 inverts one or more corresponding bits in the output of the comparison circuit 27.

The block-parity generation circuit 28 generates a set of block-based parity bits on the basis of the 16-bit output of the comparison circuit 27, and the data inversion circuit 29 compares the seven parity bits held by the parity holding circuit 25, with the seven block-based parity bits generated by the block-parity generation circuit 28. When one or more bits of the seven parity bits held by the parity holding circuit 25 are different from one or more corresponding bits of the seven block-based parity bits generated by the block-parity generation circuit 28, the data inversion circuit 29 inverts one or more corresponding bits in the output of the data inversion circuit 29, after the inversion of the one or more bits as above when the inversion is performed.

The selection circuit 30 selects and outputs the set of seven parity bits outputted from the parity generation circuit 18, or the set of seven parity bits outputted from the data inversion circuit 29, according to a selection signal, so that the set of seven parity bits selected by the selection circuit 30 is written in the memory cells. Specifically, the selection circuit 30 selects the set of seven parity bits outputted from the data inversion circuit 29 in the case where the start address is A(2) or A(6), or the set of seven parity bits outputted from the parity generation circuit 18 in the other cases.

Next, the operations of the semiconductor memory device 10c according to the third embodiment are explained. In the following explanations, it is assumed that the burst length (BL) is eight, and the size of the write block is 16 bits, as in the semiconductor memory device 10a according to the first embodiment. In this case, the 64-bit data corresponding to the successive addresses A(1) to A(4), or A(5) to A(8) constitute an ECC code.

In the case where the start address in a burst write operation is A(1), A(5), A(3), A(4), A(7), or A(8), the write recovery time (tWRB) increases (deteriorates) little as explained before with reference to FIGS. 19 and 21. Therefore, in these cases, the selection signal makes the selection circuit 30 select the set of seven parity bits outputted from the parity generation circuit 18, and outputs the selected set of seven parity bits P so as to be written in the memory cells. Thus, in the case where the start address is A(1), A(5), A(3), A(4), A(7), or A(8), the semiconductor memory device 10c according to the third embodiment operates in a similar manner to the conventional semiconductor memory device 800 as explained before with reference to FIGS. 19 and 21.

In the case where the start address in a burst write operation is A(2) or A(6), the write operations in each burst write operation are performed in three write cycles. In the first write cycle, a set of parity bits P is generated by using the data pieces C(1) to C(4) which are selected by the read/write data selection circuits 17-1, 17-2, 17-3, and 17-4 and have the total length of 64 bits, and held by the parity holding circuit 25. Hereinafter, the data pieces C(1) to C(4) which are selected by the read/write data selection circuits 17-1, 17-2, 17-3, and 17-4 in the first write cycle are respectively denoted by C1(1) to C1(4), and the set of parity bits P generated in the first write cycle is denoted by P-1. In addition, the data holding circuit 26 holds only the data piece C1(1) which is written at the leading address A(1). Further, in the third write cycle, the ECC-RD operation is not performed, and the parity generation circuit 18 generates a set of seven parity bits P-3 by using a captured write-data piece W(1).

Incidentally, each parity bit constituting parity data indicates whether the number of H (high) bits or L (low) bits in all the data bits corresponding to the parity bit is even or odd. Therefore, when the parity of data bits corresponding to each block-based parity bit is changed, the block-based parity bit is inverted. Since each parity bit constituting the finally obtained set indicates the parity of all the data bits corresponding to the parity bit, the parity bit constituting the finally obtained set indicates whether or not the number of H (or L) bits in the block-based parity bits corresponding to the data bits is even or odd. When an even number of block-based parity bits corresponding to each parity bit which constitutes the finally obtained set are inverted, the parity bit is not inverted. When an odd number of block-based parity bits corresponding to each parity bit which constitutes the finally obtained set are inverted, the parity bit is inverted. Therefore, when the data piece C1(1) which is held by the data holding circuit 26 in the first write cycle is different from the data piece C3(1) which is selected in the third write cycle for writing only the write-data piece W(1), the set of parity bits can be finally obtained by inverting one or more bits in the set of parity bits P-1.

Based on the above consideration, in the semiconductor memory device 10c according to the third embodiment, the comparison circuit 27 compares the data piece C1(1) held by the data holding circuit 26 in the first write cycle, with the data piece C3(1) selected by the read/write data selection circuit 17-1 in the third write cycle (in which only the write data piece W(1) is written). When one or more bits of the data piece C1(1) are different from one or more corresponding bits of the data piece C3(1), the comparison circuit 27 inverts one or more corresponding bits in the output of the comparison circuit 27. The block-parity generation circuit 28 generates, on the basis of the output of the comparison circuit 27, a set of seven block-based parity bits which indicates the difference between the data piece C1(1) and the data piece C3(1) (i.e., the difference between the set of parity bits P-1 and the set of parity bits P-3). The data inversion circuit 29 inverts one or more bits of the seven parity bits P-1 held by the parity holding circuit 25 so as to generate a set of parity bits for the 64 data bits containing the data piece C3(1). The selection circuit 30 selects as the set of parity bits P the output of the data inversion circuit 29. Thus, the set of parity bits P generated by the data inversion circuit 29 is written in the memory cells together with the data pieces C3(1) to C3(4).

Figure 8:
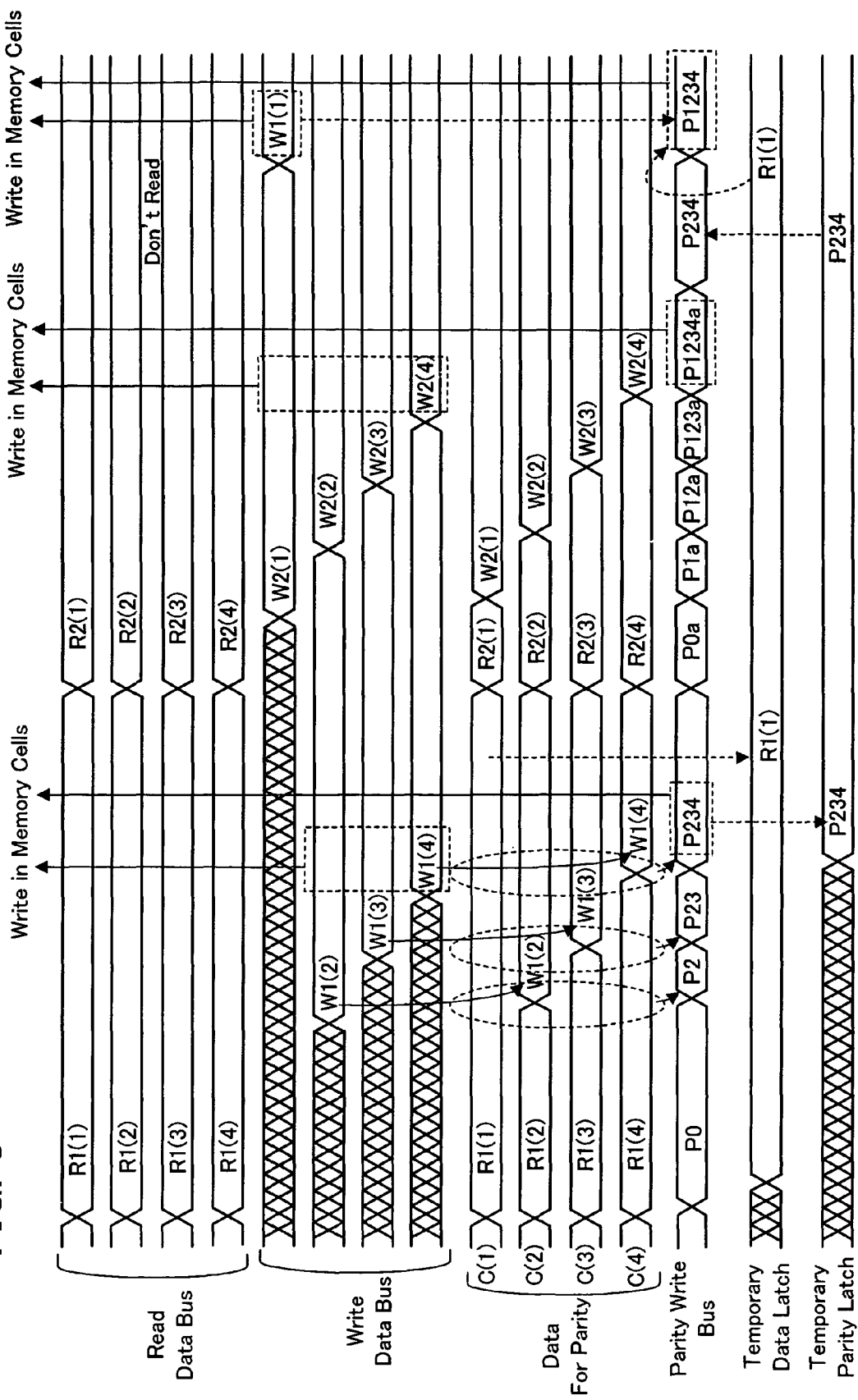
FIG. 8 is a timing diagram of signals in operations performed in the semiconductor memory device according to the third embodiment for generating a set of parity bits in the case where the start address is A(2).

Hereinbelow, details of the operations of generating the set of parity bits P in the semiconductor memory device 10c according to the third embodiment are explained with reference to FIG. 8, which is a timing diagram of signals in the operations performed in the semiconductor memory device 10c according to the third embodiment for generating the set of parity bits P in the case where the start address is A(2).

In the case where the start address in the burst write operation is A(2), the write operations in each burst write operation are performed in three write cycles. First, the ECC-RD operation is performed before the first write cycle. In the ECC-RD operation, the corrected read-data pieces R1(1) to R1(4) (each constituted by 16 bits) are read out from the memory cells onto read-data buses, and are then selected by the read/write data selection circuits 17-1, 17-2, 17-3, and 17-4. The parity generation circuit 18 generates a set of parity bits P0 on the basis of the corrected read-data pieces R1(1) to R1(4), so that the generated set of parity bits P0 is outputted on a parity-write bus. Thereafter, every time a new write-data piece is inputted, the selection by one of the read/write data selection circuits 17-1, 17-2, 17-3, and 17-4 corresponding to the inputted write-data piece is switched from one of the corrected read-data pieces R1(1) to R1(4) corresponding to the inputted write-data piece to the inputted write-data piece, and the parity generation circuit 18 newly generates a set of parity bits. For example, when the write-data piece W1(2) (constituted by 16 bits) is inputted onto a write-data bus, the data piece C(2) used for generation of a set of parity bits is changed from the read-data piece R1(2) to the write-data piece W1(2), and the parity generation circuit 18 generates a set of parity bits P2 on the basis of the write-data piece W1(2) and the corrected read-data pieces R1(1), R1(3), and R1(4), so that the generated set of parity bits P2 is outputted onto the parity-write bus. Similarly, when each of the write-data pieces W1(3) and W1(4), which are inputted one after another, is inputted, the parity generation circuit 18 successively generates a new set of parity bits in the order of P2→P23→P234. Thus, when both the write-data pieces W1(3) and W1(4) are inputted onto the write-data buses, the set of parity bits P234 is finally outputted onto the parity-write bus, so that the corrected read-data piece R1(1) and the write-data pieces W1(2) to W1(4) are selected as the data pieces C(1) to C(4), and written in the memory cells together with the set of parity bits P234.

In addition, in the semiconductor memory device 10c according to the third embodiment, the data holding circuit 26 holds the data piece C(1) (i.e., the corrected read-data piece R1(1)) in the first write cycle. In addition, the parity holding circuit 25 holds the set of parity bits P234, which is generated by the parity generation circuit 18 and corresponds to the aforementioned set of parity bits P-1. Since the operation in the second write cycle in the semiconductor memory device 10c according to the third embodiment is similar to the operation in the second write cycle in the semiconductor memory device 10a according to the first embodiment (which is explained before with reference to FIG. 4), the explanation on the operation in the second write cycle is not repeated.

In the third write cycle, the set of parity bits P234 held by the parity holding circuit 25 is read out onto the parity-write bus, and then the read data R1(1) held by the data holding circuit 26 and a write-data piece W1(1) which is to be written in the third write cycle are compared by the comparison circuit 27. When the read data R1(1) held by the data holding circuit 26 is different from the write-data piece W1(1), a set of block-based parity bits corresponding to the difference is generated by the block-parity generation circuit 28, and the set of parity bits P234 corresponding to the different data bits are updated on the basis of the set of block-based parity bits generated by the block-parity generation circuit 28, so as to generate the set of parity bits P1234 for the 64 data bits (the data pieces C(1) to C(4)) to be written in the memory cells). Finally, the set of parity bits P1234 is outputted through the selection circuit 30, and written in the memory cells together with the data pieces C(1) to C(4).

As explained above, in the semiconductor memory device 10c according to the third embodiment, even in the case where the start address of a burst write operation is A(2), the ECC-RD operation is not performed in the third write cycle in the burst-mode operation, and therefore the write recovery time (tWRB) is not increased. In addition, since only the 16 data bits and the seven parity bits are required to be held, the circuit size can be reduced.

Fourth Embodiment

Figure 9:
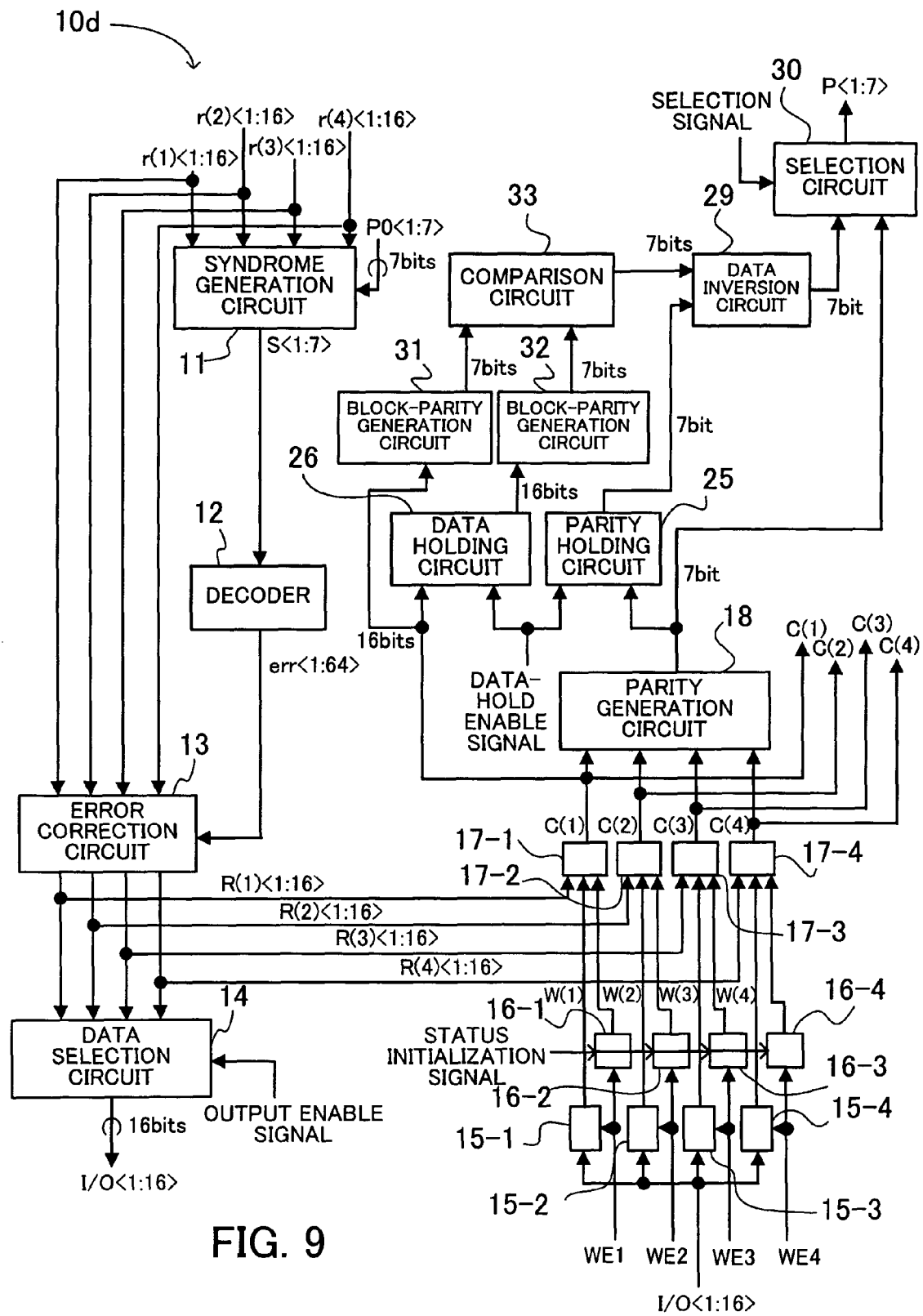
FIG. 9 is a block diagram of circuitry in a semiconductor memory device according to a fourth embodiment of the present invention.

FIG. 9 is a block diagram of circuitry in a semiconductor memory device according to the fourth embodiment of the present invention. The semiconductor memory device 10d illustrated in FIG. 9 is different from the semiconductor memory device 10c according to the third embodiment in comprising first and second block-parity generation circuits 31 and 32 and a comparison circuit 33.

The first block-parity generation circuit 31 generates a first set of block-based parity bits on the basis of the (16-bit) data piece C(1) selected by the read/write data selection circuit 17-1, and the second block-parity generation circuit 32 generates a second set of block-based parity bits on the basis of the (16-bit) data piece held by the data holding circuit 26. The comparison circuit 33 compares the first and second sets of block-based parity bits generated by the first and second block-parity generation circuits 31 and 32.

The operations of the semiconductor memory device 10d according to the fourth embodiment are explained below. The following explanations are concentrated on the differences from the semiconductor memory device 10c according to the third embodiment.

In the case where the start address in the burst write operation is A(2), the semiconductor memory device 10c according to the third embodiment compares the read-data piece R1(1) held by the data holding circuit 26 in the first write cycle and the write-data piece W1(1) selected in the third write cycle, and generates a set of block-based parity bits on the basis of the comparison result. On the other hand, in the semiconductor memory device 10d according to the fourth embodiment, the comparison circuit 33 compares the first set of block-based parity bits generated by the first block-parity generation circuit 31 on the basis of the data piece C3(1) selected in the third write cycle (i.e., the write-data piece W1(1)), with the second set of block-based parity bits generated by the second block-parity generation circuit 32 on the basis of the data piece C1(1) held by the data holding circuit 26 in the first write cycle (i.e., the read-data piece R1(1)). When the first and second sets of block-based parity bits are different in one or more bits, the comparison circuit 33 inverts one or more corresponding bits in the output of the comparison circuit 33. The other operations of the semiconductor memory device 10d according to the fourth embodiment are similar to the semiconductor memory device 10c according to the third embodiment.

Fifth Embodiment

Figure 10:
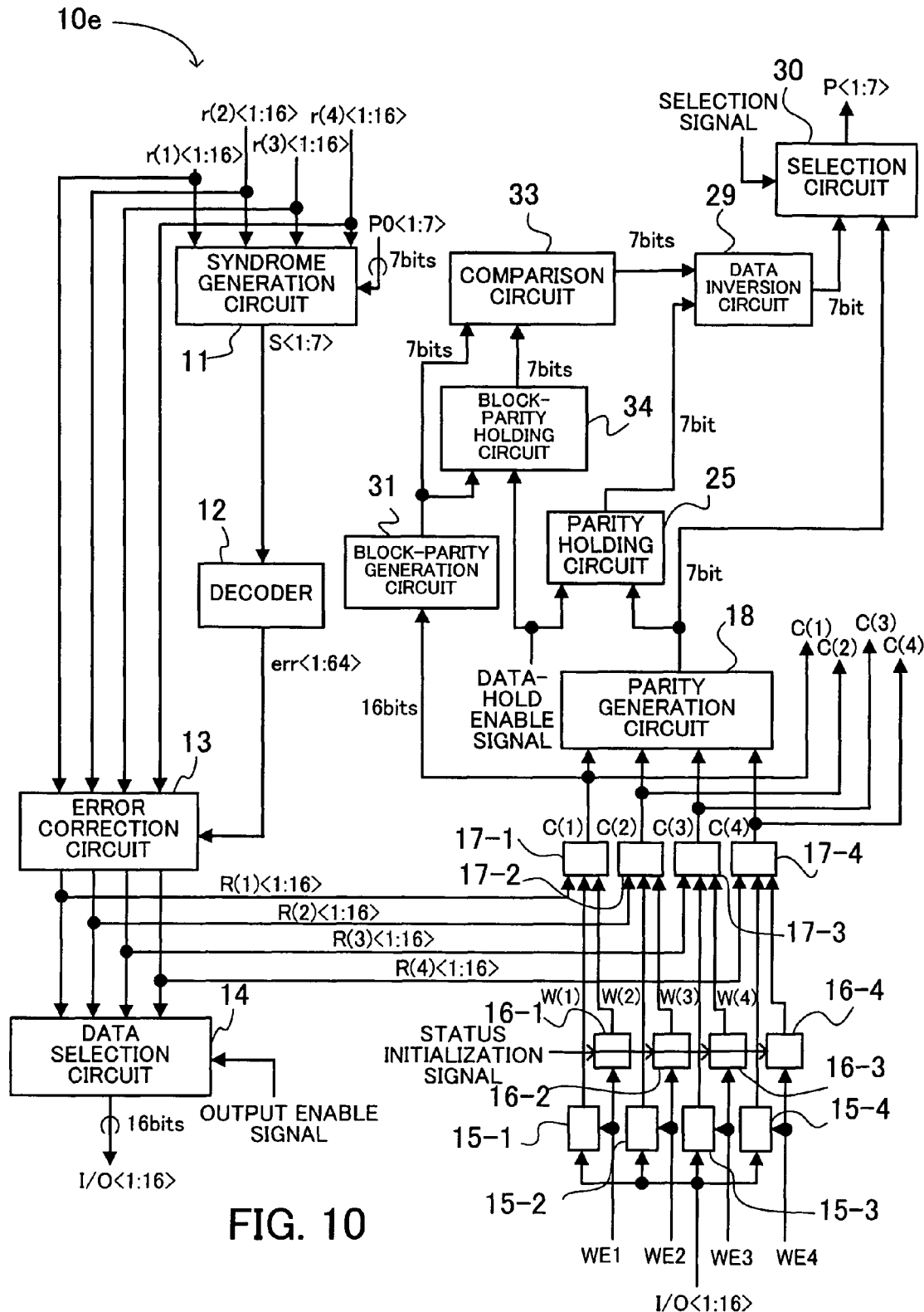
FIG. 10 is a block diagram of circuitry in a semiconductor memory device according to a fifth embodiment of the present invention.
Figure 12A:
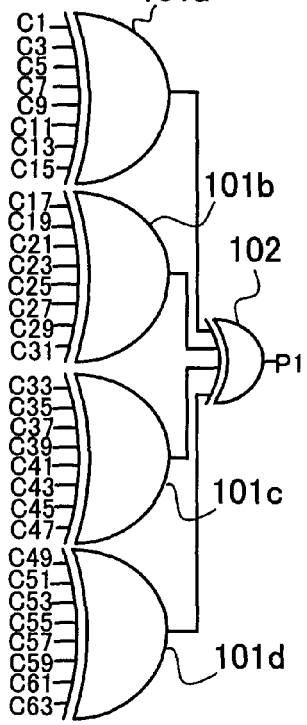
Figure 12B:
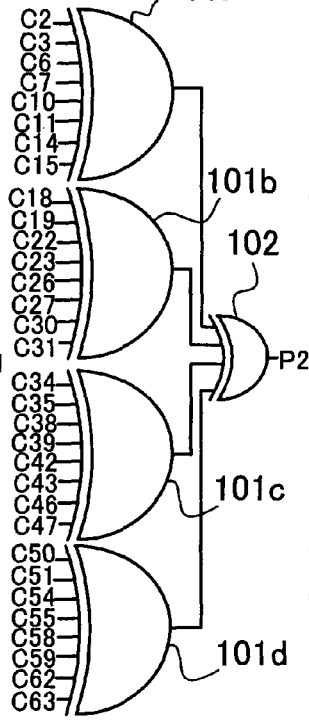
Figure 12C:
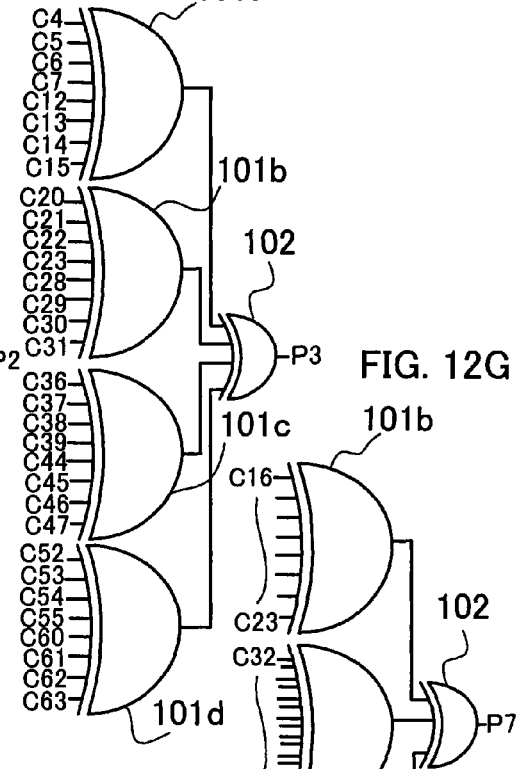
Figure 12D:
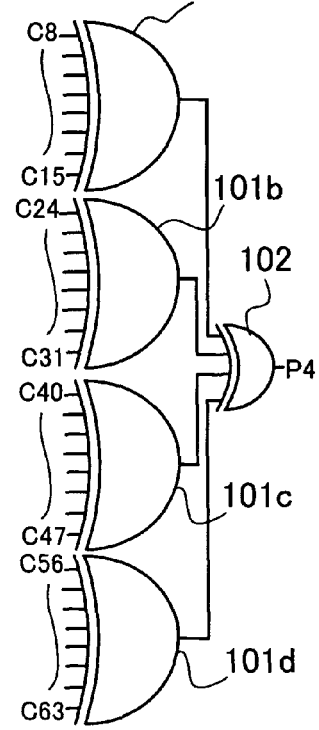
Figure 12E:
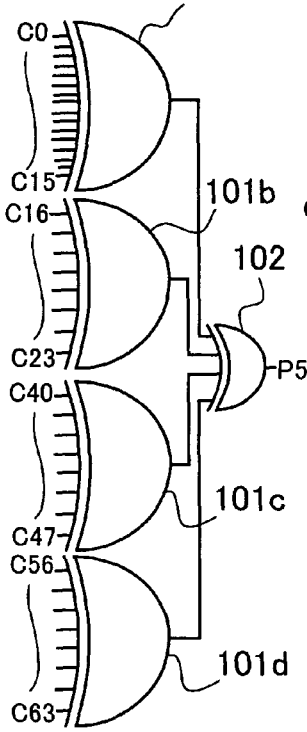
Figure 12F:
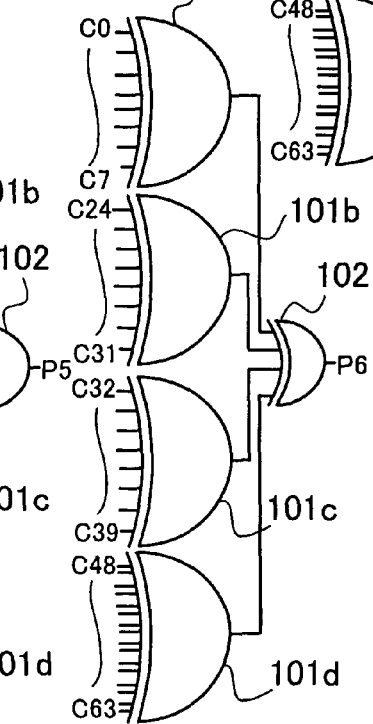

FIG. 10 is a block diagram of circuitry in a semiconductor memory device according to the fifth embodiment of the present invention. The semiconductor memory device 10e illustrated in FIG. 10 is different from the semiconductor memory device 10d according to the fourth embodiment in comprising a block-parity holding circuit 34 instead of the data holding circuit 26, and the block-parity holding circuit 34 holds the set of block-based parity bits generated by the first block-parity generation circuit 31.

In the semiconductor memory device 10d according to the fourth embodiment, the data piece C(1) for which a set of block-based parity bits is to be generated is held by the data holding circuit 26. On the other hand, in the semiconductor memory device 10e according to the fifth embodiment, the set of block-based parity bits generated by the first block-parity generation circuit 31 in the first write cycle is held by the block-parity holding circuit 34, and compared by the comparison circuit 33 with a set of block-based parity bits generated on the basis of the data piece C3(1) which is selected in the third write cycle. The other operations of the semiconductor memory device 10e according to the fifth embodiment are similar to the semiconductor memory device 10d according to the fourth embodiment. Since the number of the bits held in the semiconductor memory device 10e according to the fifth embodiment is further smaller than the numbers of the bits held in the first to fourth embodiments, the circuit size of the semiconductor memory device 10e according to the fifth embodiment can be small compared with the semiconductor memory devices 10a to 10e according to the first to fourth embodiments.

Parity Generation Circuit

Hereinbelow, concrete examples of the parity generation circuits used in the semiconductor memory devices in the first to fifth embodiments are explained below.

Figure 11:
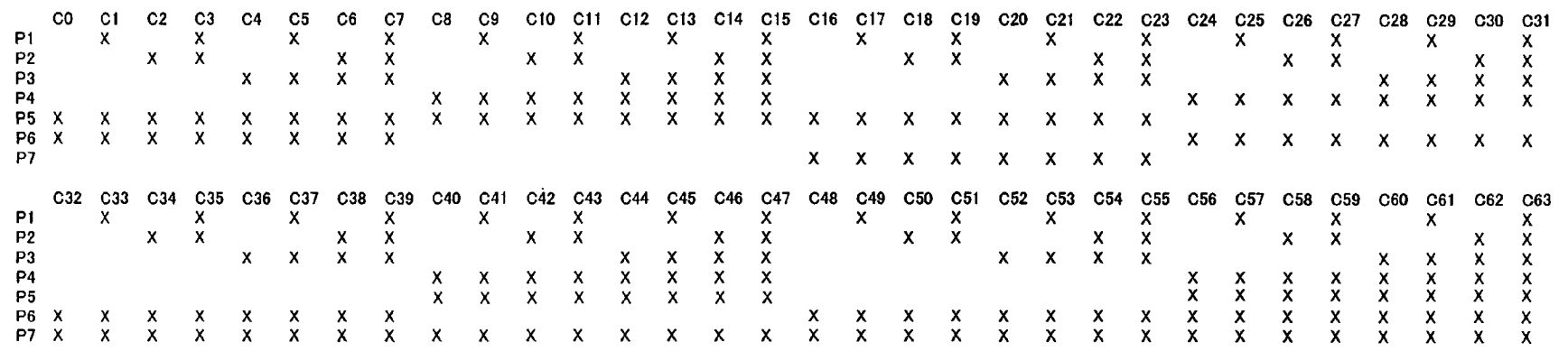

FIG. 11 is a diagram illustrating data bits used for generation of parity bits in an example of an ECC code in which seven parity bits are generated for 64 data bits, and FIGS. 12A, 12B, 12C, 12D, 12E, 12F, and 12G are diagrams of circuits for generating parity bits in the ECC code indicated in FIG. 11.

In the example of FIGS. 11, 12A, 12B, 12C, 12D, 12E, 12F, and 12G, the 16 bits C0 to C15 constitute the data piece C(1), the 16 bits C16 to C31 constitute the data piece C(2), the 16 bits C32 to C47 constitute the data piece C(3), and the 16 bits C48 to C63 constitute the data piece C(4).

The parity generation circuits illustrated in FIGS. 12A, 12B, 12C, 12D, 12E, 12F, and 12G are circuits for obtaining the parity bits P1 to P7, respectively. That is, the aforementioned parity generation circuit can be realized by the circuits illustrated in FIGS. 12A, 12B, 12C, 12D, 12E, 12F, and 12G.

Each of the circuits for obtaining the parity bits P1 to P6 is constituted by the ExOR circuits 101a, 101b, 101c, 101d, and 102, and the circuit for obtaining the parity bit P7 is constituted by the ExOR circuits 101b, 101c, 101d, and 102. In each of the circuits for obtaining the parity bits P1 to P7, the ExOR circuit 101a calculates the ExOR of the data bits in the 16-bit write block C(1) indicated by x in FIG. 11. In addition, in each of the circuits for obtaining the parity bits P1 to P6, the ExOR circuit 101b calculates the ExOR of the data bits in the 16-bit write block C(2) indicated by x in FIG. 11, the ExOR circuit 101c calculates the ExOR of the data bits in the 16-bit write block C(3) indicated by x in FIG. 11, the ExOR circuit 101d calculates the ExOR of the data bits in the 16-bit write block C(4) indicated by x in FIG. 11, and the ExOR circuit 102 calculates the ExOR of the outputs of the ExOR circuits 101a, 101b, 101c, and 101d. In the circuit for obtaining the parity bit P7, the ExOR circuit 102 calculates the ExOR of the outputs of the ExOR circuits 101b, 101c, and 101d.

That is, the ExOR circuits 101a, 101b, 101c, and 101d realize the aforementioned block-parity generation circuits for generating the sets of block-based parity bits of the 16-bit data pieces (write blocks) C(1), C(2), C(3), and C(4), respectively, and the ExOR circuit 102 realizes the aforementioned parity synthesis circuit, which synthesizes the sets of block-based parity bits.

For example, the parity bit P1 is obtained by performing the first ExOR operation of the data bits C1, C3, C5, C7, C9, C11, C13, and C15, the second ExOR operation of the data bits C17, C19, C21, C23, C25, C27, C29, and C31, the third ExOR operation of the data bits C33, C35, C37, C39, C41, C43, C45, and C47, and the four ExOR operation of the data bits C49, C51, C53, C55, C57, C59, C61, and C63, and further calculating the ExOR of the results of the first to four ExOR operations. The ECC function enables correction of a one-bit error by generating the parity bits P1 to P7 in the ECC code indicated in FIG. 11.

Alternatively, it is possible to use another type of ECC code which is constituted for the case where each write block (word structure) is constituted by $2^n$ bits. In such a type of ECC code, the number of parity bits is m, each data bit constituting each write block can be identified by n parity bits out of the m parity bits, and each write block can be identified by the (m-n) other parity bits.

Figure 13:
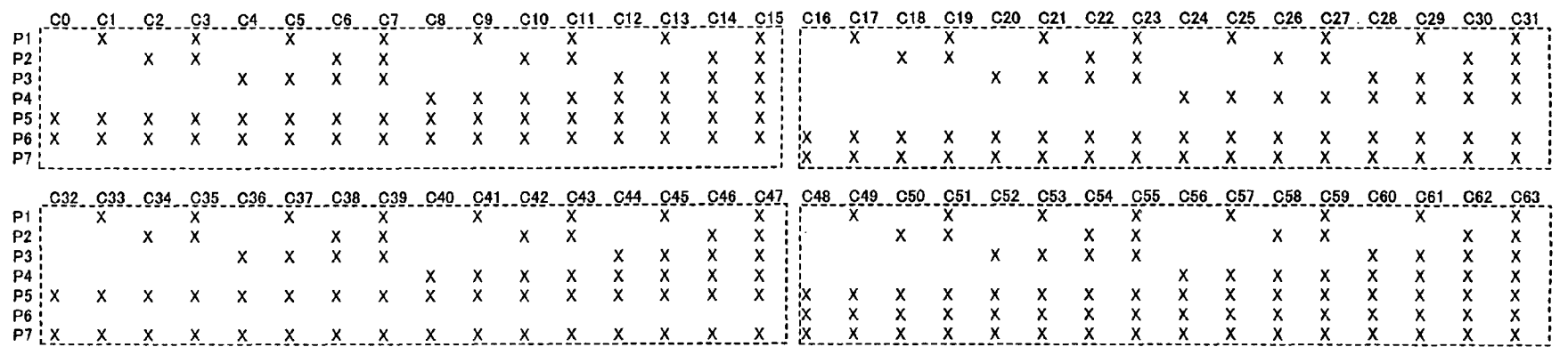

FIG. 13 is a diagram illustrating data bits used for generation of block-based parity bits in an example of the above type of ECC code. In the example of FIG. 13, seven block-based parity bits are generated for 16 data bits. That is, m=7, and n=4. In FIG. 13, each dashed block corresponds to a write block, and the data bits used in generation of the seven parity bits P1 to P7 are indicated by x. The ECC code indicated in FIG. 13, the data bits used for generation of block-based parity bits are assigned in such a manner that each data bit in a write block can be identified by the four parity bits P1 to P4 (corresponding to the block-based parity bits) out of the seven parity bits P1 to P7, and each write block can be identified by the three other parity bits P5 to P7.

FIGS. 14A, 14B, 14C, 14D, and 14E are diagrams of circuits for generating parity bits in the ECC code indicated in FIG. 13.

The parity generation circuits illustrated in FIGS. 14A, 14B, 14C, and 14D are circuits for obtaining the parity bits P1 to P4, respectively. As the parity generation circuits illustrated in FIGS. 12A, 12B, 12C, and 12D, each of the circuits for obtaining the parity bits P1 to P4 (illustrated in FIGS. 14A, 14B, 14C, and 14D) is constituted by ExOR circuits 111a, 111b, 111c, 111d, and 112. In addition, the circuit for obtaining the parity bits P5 to P7 (illustrated in FIG. 14E) is constituted by ExOR circuits 111a, 111b, 111c, 111d, 112a, 112b, and 112c. Thus, each of the aforementioned parity generation circuits 18 can be realized by the circuits illustrated in FIGS. 14A, 14B, 14C, 14D, and 14E.

In each of the circuits illustrated in FIGS. 14A, 14B, 14C, 14D, and 14E, the ExOR circuit 111a calculates the ExOR of the data bits indicated by x in the first 16-bit write block in FIG. 13, the ExOR circuit 111b calculates the ExOR of the data bits indicated by x in the second 16-bit write block in FIG. 13, the ExOR circuit 111c calculates the ExOR of the data bits indicated by x in the third 16-bit write block in FIG. 13, and the ExOR circuit 111d calculates the ExOR of the data bits indicated by x in the fourth 16-bit write block in FIG. 13.

In each of the circuits illustrated in FIGS. 14A, 14B, 14C, and 14D, the ExOR circuit 112 calculates the ExOR of the outputs of the ExOR circuits 111a, 111b, 111c, and 111d.

Figure 14A:
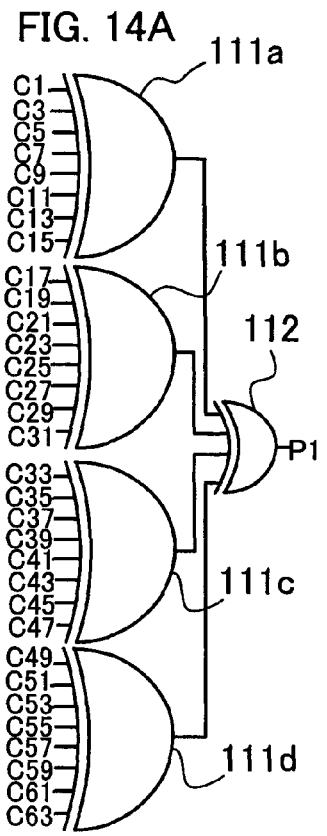
FIGS. 14A, 14B, 14C, 14D, and 14E are diagrams of circuits for generating parity bits in the ECC code indicated in FIG. 13.
Figure 14B:
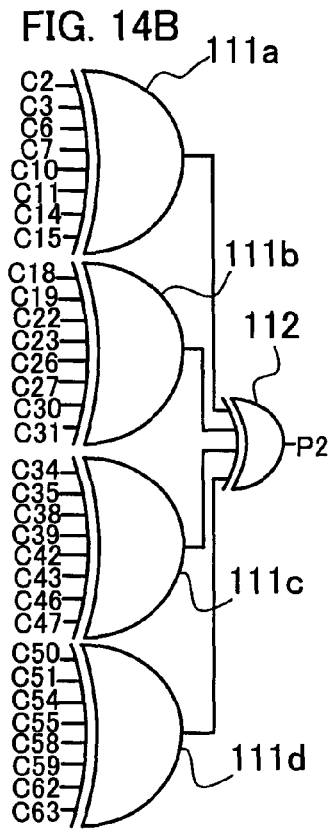
Figure 14C:
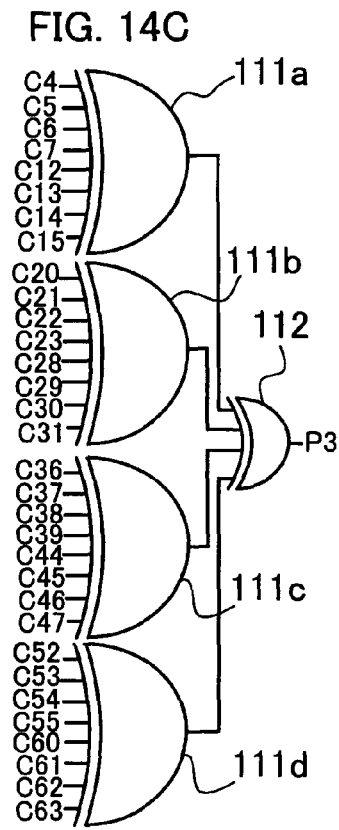
Figure 14D:
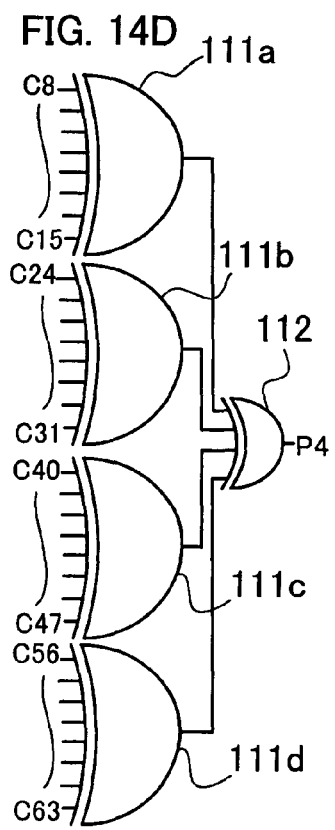
Figure 14E:
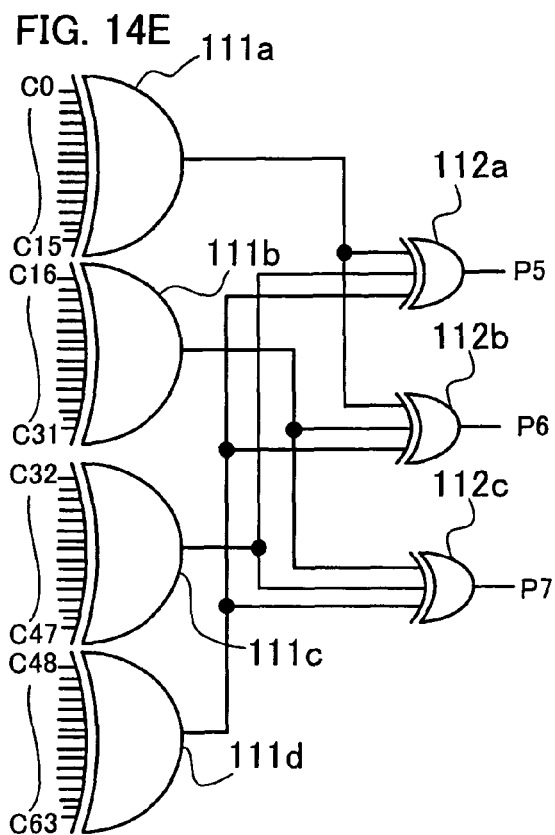
Figure 15:
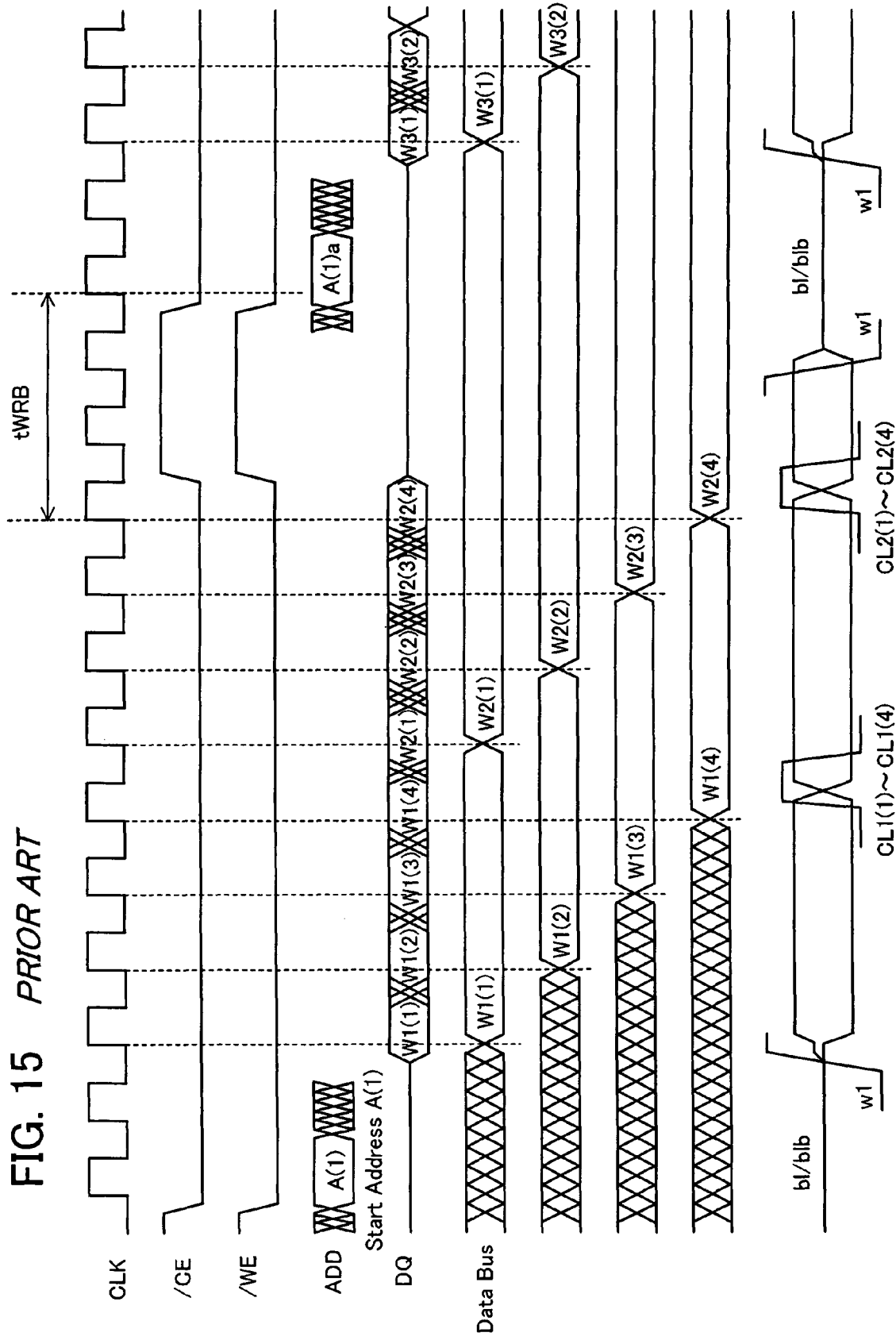
FIG. 15 is a timing diagram of signals in a burst-mode (write) operation performed in a conventional semiconductor memory device in the case where the start address is A(1).
Figure 16:
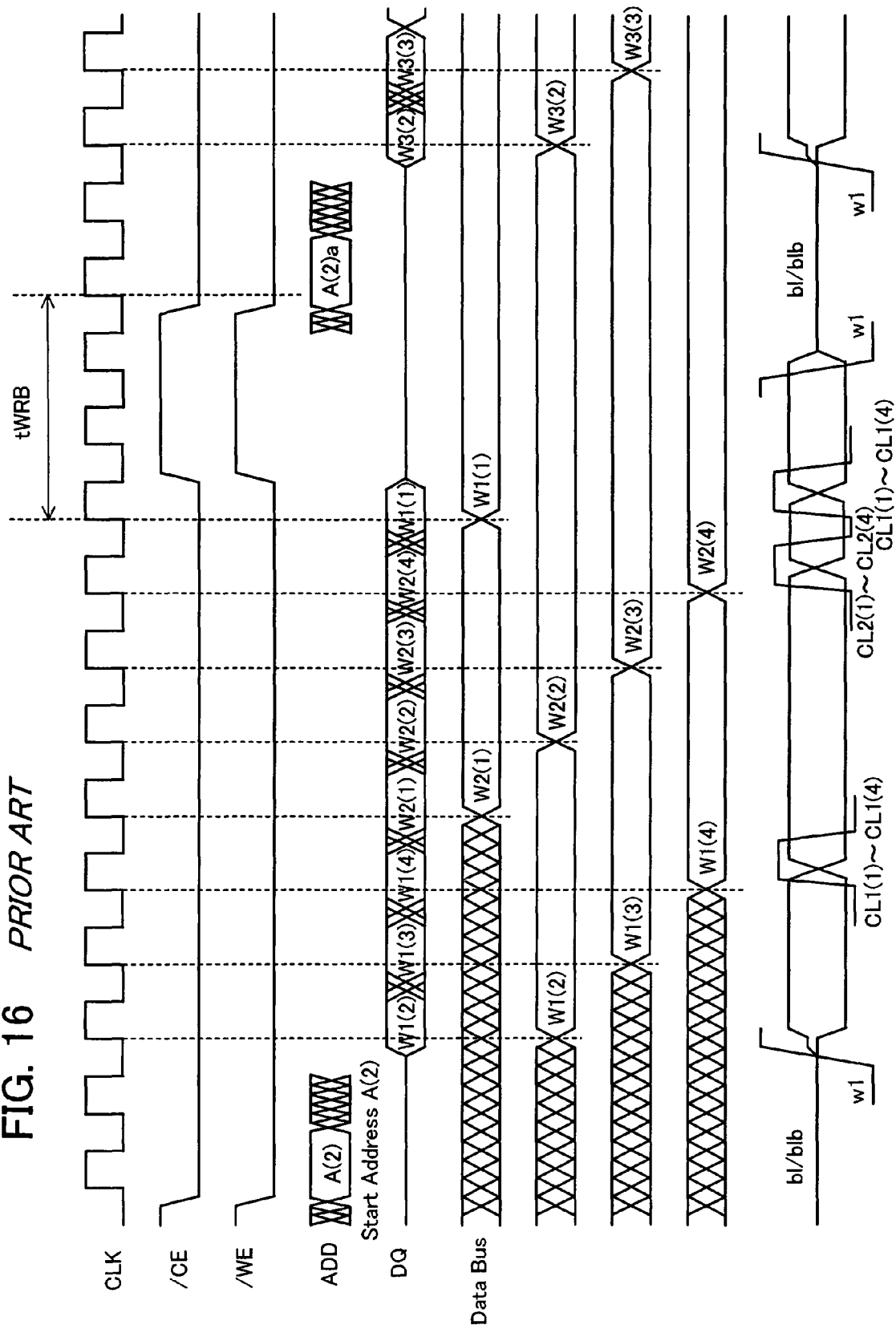
FIG. 16 is a timing diagram of signals in a burst-mode (write) operation performed in the conventional semiconductor memory device in the case where the start address is A(2).
Figure 17:
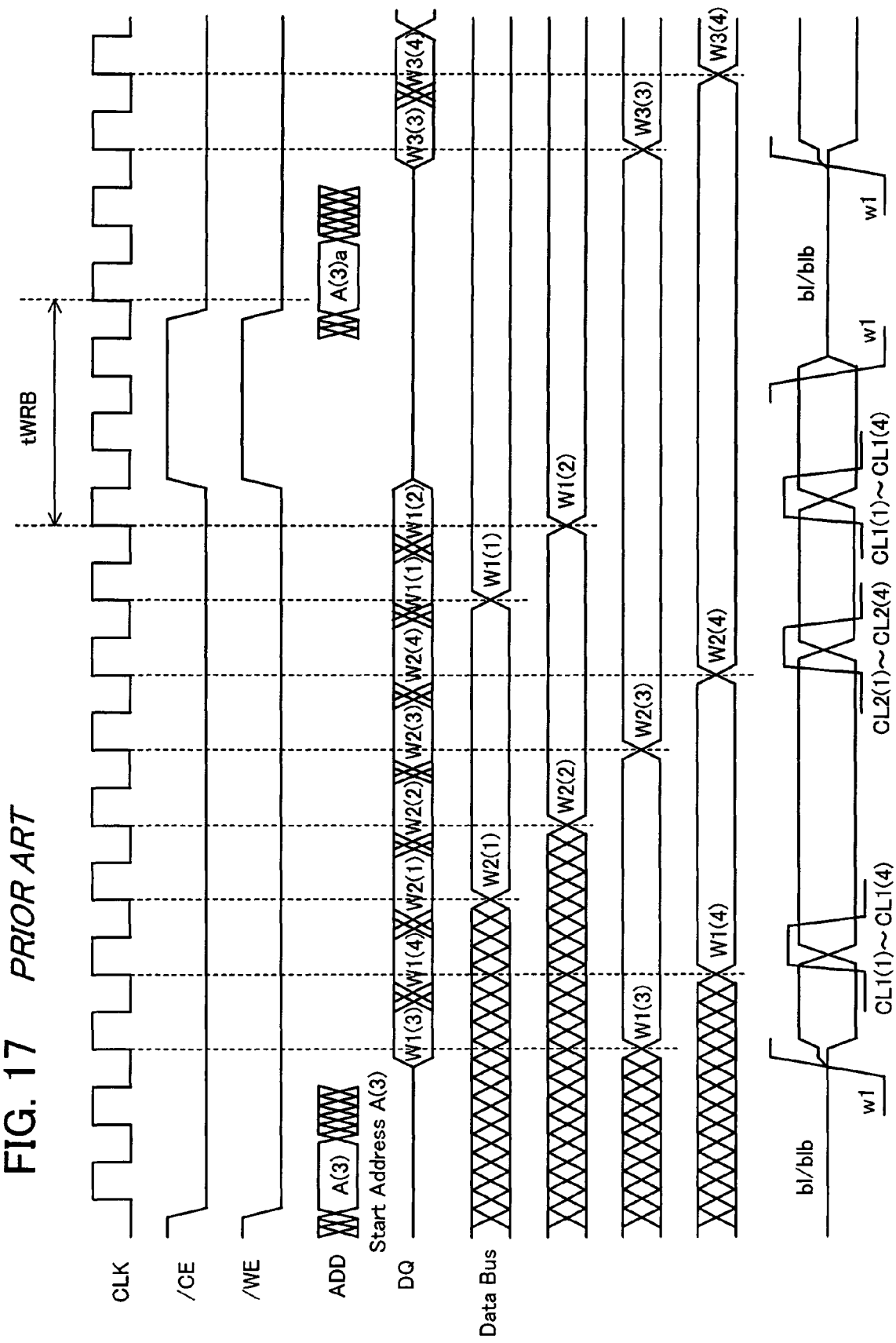
FIG. 17 is a timing diagram of signals in a burst-mode (write) operation performed in the conventional semiconductor memory device in the case where the start address is A(3).

On the other hand, in the circuit illustrated in FIG. 14E, each of the ExOR circuits 112a, 112b, and 112c calculates the ExOR of the outputs of a different combination of three of the ExOR circuits 111a, 111b, 111c, and 111d, so that the ExOR circuits 112a, 112b, and 112c output the parity bits P5 to P7, respectively.

In the case where the parity generation circuit realized by the circuits illustrated in FIGS. 14A, 14B, 14C, 14D, and 14E is used in the semiconductor memory devices 10b, 10c, 10d, and 10e according to the second to fifth embodiments (in which parity bits are held), the number of parity bits necessary to be held can be reduced to four, so that the circuit size can be further reduced, and the circuit load can also be reduced.

In the cases taken as examples in the above explanations, the ECC code is composed of 64 data bits and 7 parity bits. However, the present invention is not limited to such a case, and can be applied to any cases where the total number of data bits outputted in each burst-mode operation (i.e., the product of the number of data bits constituting a word structure and the burst length (BL)) is greater than the number of data bits constituting an ECC code. For example, when the number of data bits constituting a word structure is 16, and BL=8, the total number of data bits outputted in each burst-mode operation is 128. In this case, for example, an ECC code composed of 32 data bits and parity bits can be used as well as the ECC code composed of 64 data bits and 7 parity bits. Alternatively, when the number of data bits constituting a word structure is 16, and BL=16, the total number of data bits outputted in each burst-mode operation is 256. In this case, for example, an ECC code composed of 128 data bits and 8 parity bits can be used.

As explained before, the ECC code is constituted by data pieces corresponding to a plurality of successive addresses in an address range designated when each burst-mode operation is requested. For example, in the case where the address range of A(1) to A(8) is designated (i.e., BL=8) and an ECC code composed of 32 data bits and 6 parity bits is used, the ECC code is constituted by 32 data bits corresponding to the addresses A(1) and A(2), A(3) and A(4), A(5) and A(6), or A(7) and A(8). Alternatively, in the case where the address range of A(1) to A(16) is designated (i.e., BL=16) and an ECC code composed of 128 data bits and 8 parity bits is used, the ECC code is constituted by 128 data bits corresponding to the addresses A(1) to A(8), or A(9) and A(16).

As explained above, according to the present invention, a first set of data bits constituting a code (which enables correction of a single-bit error) and being written at a plurality of addresses of the memory cells in the leading write cycle in a burst write operation (which includes a plurality of write cycles in each of which data bits and parity bits constituting the code are written in the memory cells), or a set of parity bits constituting the code and being generated on the basis of the first set of data bits is held, and the set of parity bits written in the memory cells in the leading write cycle is updated in the final write cycle in the burst write operation on the basis of the first set of data bits or the set of parity bits held in the leading write cycle and a second set of data bits required to be written at one of the plurality of addresses of the memory cells in the final write cycle, when the one of the plurality of addresses is designated for the final write cycle. Therefore, it is unnecessary to access the memory core in the final write cycle of the burst write operation, and it is possible to suppress deterioration of (increase in) the write recovery time even in the case where the burst write operation is started from the second address from the top of the address range designated for indicating data bits constituting the code.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having a function of correcting a defective bit by using a code which enables correction of a single-bit error and includes data corresponding to successive addresses in an address range designated for a burst-mode operation, comprising:
    memory cells;
    a holding circuit to hold one or both of at least a portion of a first set of data bits and at least a portion of a second set of data bits, wherein the first set of data bits and a set of parity bits constitute at least a portion of the code and are written in the memory cells in one of a plurality of write cycles included in a burst write operation, the set of parity bits is generated on the basis of the first set of data bits, and the second set of data bits is read from the memory cells prior to the burst write operation; and
    a parity updating circuit to update, in a final write cycle of the plurality of write cycles in the burst write operation, the set of parity bits written in the memory cells in the one of the plurality of write cycles, on the basis of the first set of data bits.

2. The semiconductor memory device according to claim 1, wherein the holding circuit holds the portion of the first set of data bits or the set of parity bit when the burst write operation is started from a second address following a first address corresponding to the one of a plurality of write cycles.

3. The semiconductor memory device according to claim 1, wherein, when a minimum unit of data written in the memory cells includes 2n bits, each data bit corresponding to the minimum unit is identified by n parity bits out of the parity bits including m parity bits, and each set of data bits corresponding to the minimum unit is identified by (m-n) parity bits out of the parity bits other than the n parity bits.

4. The semiconductor memory device according to claim 1, wherein the parity updating circuit includes
    a parity generation circuit to generate the of parity bits based on the first set of data bits, and substitute data bits of the first set of data bits corresponding to at least one of the plurality of addresses with data bits written in the memory cells in a final write cycle of the plurality of the write cycles and updates the set of parity bits.

5. The semiconductor memory device according to claim 1, wherein the parity updating circuit includes
a block-parity generation circuit to generate a plurality of sets of block-based parity bits on the basis of a plurality of sets of data bits constituting the code and being written in a plurality of addresses of the memory cells in each of a plurality of write cycles included in a burst write operation, wherein each of the plurality of sets of data bits corresponds to a minimum unit of data written in the memory cells;
a holding circuit to hold and output the plurality of sets of block-based parity bits in one of the plurality of write cycles;
a comparison circuit to compare the plurality of sets of block-based parity bits in the holding circuit with a plurality of sets of block-based parity bits generated by the block-parity generation circuit in a final write cycle of the plurality of write cycles, when one of the plurality of addresses is designated for the final one of the plurality of write cycles, and inverts one or more parity bits in the plurality of sets of block-based parity bits when the one or more parity bits in the plurality of sets of block-based parity bit in the final write cycle are different from one or more parity bits in plurality of sets of block-based parity bits in the holding circuit; and
a parity synthesis circuit to generate a set of parity bits constituting the code and being written in the memory cells in the final write cycle by synthesizing the plurality of sets of block-based parity bits outputted from the comparison circuit.

6. The semiconductor memory device according to claim 1, wherein the parity updating circuit updates when an address corresponding to the portion is designated in the final write cycle.

7. The semiconductor memory device according to claim 1, wherein the one of the plurality of write cycles is a primary write cycle.

8. The semiconductor memory device according to claim 4, wherein the parity updating circuit updates when the at least one of the plurality of addresses is designated in the final write cycle.

9. The semiconductor memory device according to claim 4, wherein the one of the plurality of write cycles is a primary write cycle.

10. The semiconductor memory device according to claim 5, wherein the one of the plurality of write cycles is a primary write cycle.

* * * * *